(12) United States Patent
Chen et al.

(10) Patent No.: US 9,953,920 B2
(45) Date of Patent: Apr. 24, 2018

(54) INTERCONNECT STRUCTURE AND METHOD

(71) Applicant: Taiwan Semiconductor Manufacturing Company, Ltd., Hsin-Chu (TW)

(72) Inventors: Hsin-Yu Chen, Taipei (TW); Ku-Feng Yang, Baoshan Township (TW); Tasi-Jung Wu, Hsin-Chu (TW); Lin-Chih Huang, Hsin-Chu (TW); Yuan-Hung Liu, Hsin-Chu (TW); Tsang-Jiuh Wu, Hsin-Chu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/685,023

(22) Filed: Apr. 13, 2015

(65) Prior Publication Data
US 2015/0235940 A1 Aug. 20, 2015

Related U.S. Application Data

(62) Division of application No. 13/601,265, filed on Aug. 31, 2012, now Pat. No. 9,006,101.

(51) Int. Cl.
| | |
|---|---|
| *H01L 21/00* | (2006.01) |
| *H01L 23/528* | (2006.01) |
| *H01L 23/522* | (2006.01) |
| *H01L 27/06* | (2006.01) |
| *H01L 23/538* | (2006.01) |

(52) U.S. Cl.
CPC ........ *H01L 23/528* (2013.01); *H01L 23/5226* (2013.01); *H01L 23/5384* (2013.01); *H01L 27/0617* (2013.01)

(58) Field of Classification Search
CPC ............. H01L 23/5226; H01L 23/5384; H01L 27/0617
See application file for complete search history.

(56) References Cited

U.S. PATENT DOCUMENTS

| | | | |
|---|---|---|---|
| 4,663,414 A * | 5/1987 | Estes | ...................... C08G 77/48 252/511 |
| 5,877,076 A | 3/1999 | Dai | |
| 7,122,465 B1 | 10/2006 | Ang et al. | |
| 7,365,001 B2 | 4/2008 | Yang et al. | |

(Continued)

OTHER PUBLICATIONS

Kuroki et al., "Photosensitive Porous low-K interlayer dielectric film", 21$^{st}$ century COE the third Int. Workshop, Dec. 6, 2004., pp. 170-174.*

*Primary Examiner* — Richard Booth
(74) *Attorney, Agent, or Firm* — Slater Matsil, LLP

(57) ABSTRACT

An apparatus comprises an interlayer dielectric layer formed on a first side of a substrate, a first photo-sensitive dielectric layer formed over the interlayer dielectric layer, wherein the first photo-sensitive dielectric layer comprises a first metal structure and a second photo-sensitive dielectric layer formed over the first photo-sensitive dielectric, wherein the second photo-sensitive dielectric layer comprises a second metal structure having a bottom surface coplanar with a top surface of the first metal structure.

20 Claims, 23 Drawing Sheets

(56) References Cited

U.S. PATENT DOCUMENTS

| | | |
|---|---|---|
| 2005/0095839 A1 | 5/2005 | Chang et al. |
| 2005/0136635 A1 | 6/2005 | Savastiouk et al. |
| 2009/0079075 A1 | 3/2009 | Lin et al. |
| 2009/0174067 A1 | 7/2009 | Lin |
| 2010/0181682 A1 | 7/2010 | Arai |
| 2010/0227471 A1 | 9/2010 | Leung et al. |
| 2010/0237502 A1 | 9/2010 | Yu et al. |
| 2011/0278732 A1 | 11/2011 | Yu et al. |
| 2014/0148007 A1 | 5/2014 | Kim et al. |

\* cited by examiner

US 9,953,920 B2

INTERCONNECT STRUCTURE AND METHOD

This application is a divisional of U.S. patent application Ser. No. 13/601,265, entitled "Interconnect Structure and Method," filed on Aug. 31, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

One such creative packaging technique is the fabrication of interconnect structures, e.g., vias and metal lines. A complementary metal oxide semiconductor (CMOS) device may include a variety of semiconductor structures such as transistors, capacitors, resistors and/or the like. One or more conductive layers comprising metal lines are formed over the semiconductor structures and separated by adjacent dielectric layers. Vias are formed in the dielectric layers to provide an electrical connection between adjacent metal lines. In sum, metal lines and vias interconnect the semiconductor structures and provide a conductive channel between the semiconductor structures and the external contacts of the CMOS device.

A metal lines and its adjacent via may be formed by using a dual damascene process. According to the fabrication process of a dual damascene structure, a dual damascene opening comprising a via portion and a trench portion is formed within a dielectric layer. The dual damascene opening may be formed by photolithography techniques known in the art. Generally, photolithography involves depositing a photoresist material and then irradiating (exposing) and developing in accordance with a specified pattern to remove a portion of the photoresist material. The remaining photoresist material protects the underlying material from subsequent processing steps, such as etching. The etching process may be a wet or dry, anisotropic or isotropic, etch process, but preferably is an anisotropic dry etch process. After the etching process, the remaining photoresist material may be removed. It should also be noted that the damascene interconnect opening may be formed by one or more alternative process steps (e.g., a via first or a trench first damascene process).

After the dual damascene opening is formed, a barrier layer and a seed layer may be formed on the sidewalls and the bottom of the dual damascene opening. Furthermore, an electroplating process may be applied to the dual damascene opening. As a result, the dual damascene opening is filled with a conductive material. The conductive material may comprise copper, although other suitable materials such as aluminum, alloys, tungsten, silver, doped polysilicon, combinations thereof, and/or the like, may alternatively be utilized.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, namely an interconnect structure of a semiconductor device. The embodiments of the disclosure may also be applied, however, to a variety of semiconductor devices of the semiconductor industry. Hereinafter, various embodiments will be explained in detail with reference to the accompanying drawings.

Figure 1:
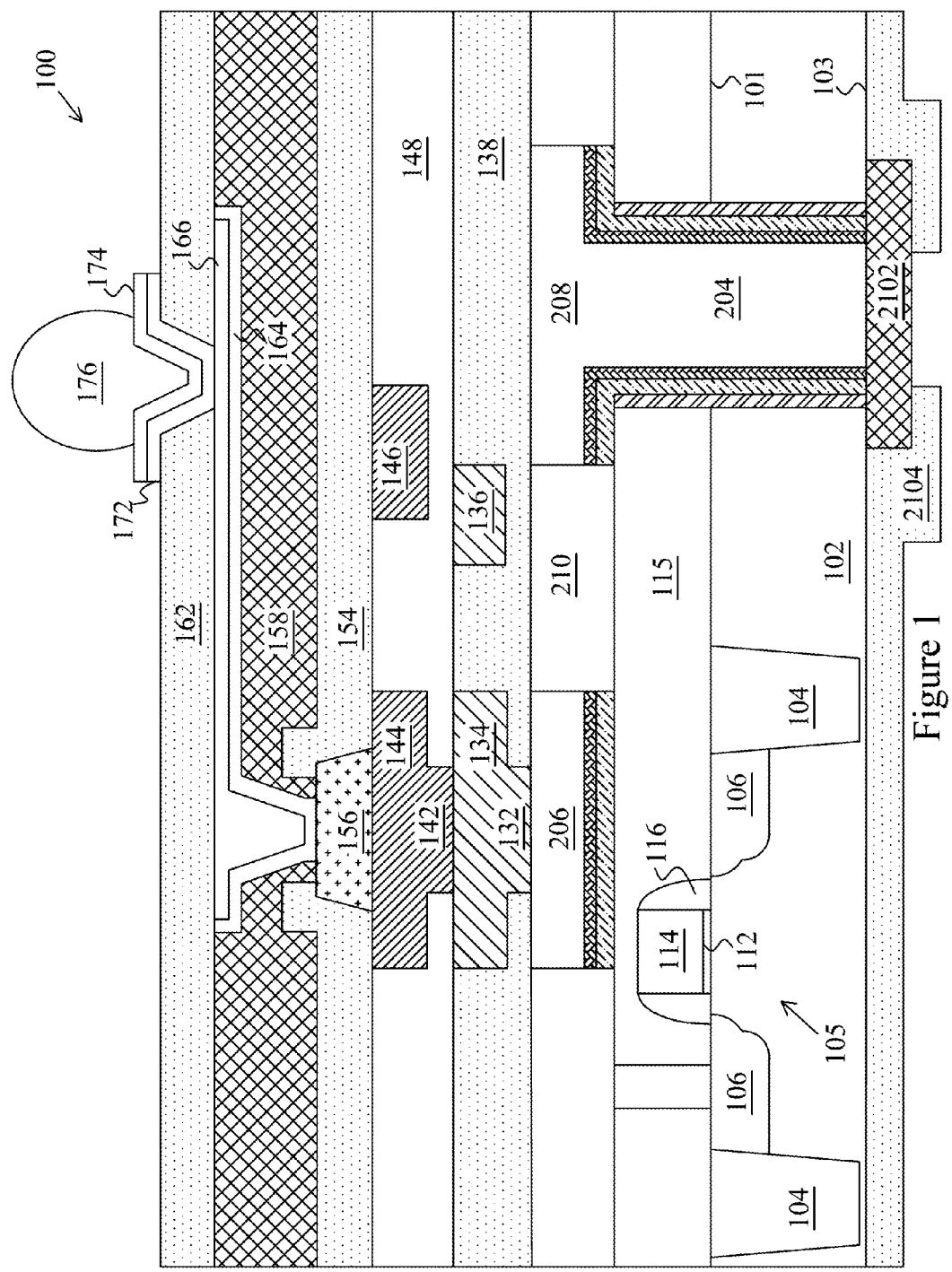
FIG. 1 illustrates a cross sectional view of a semiconductor device in accordance with an embodiment.

FIG. 1 illustrates a cross sectional view of a semiconductor device in accordance with an embodiment. The semiconductor device 100 comprises a plurality of front side interconnect structures such as metal lines (e.g., metal lines 134 and 144), vias (e.g., vias 132 and 142), metal pads (e.g., metal pad 156), redistribution lines (e.g., redistribution line 166), bumps (e.g., bump 176) and the like. As shown in FIG. 1, the front side interconnect structures are formed over a first side 101 of a substrate 102. The substrate 102 may comprise a variety of electrical circuits (e.g., transistor 105) and through vias (e.g. through via 204). The electrical circuits are formed within and on the first side 101 of the substrate 102. The semiconductor device 100 further comprises backside interconnect structures (e.g., backside contact pad 2102). As shown in FIG. 1, the backside contact pad 2102 is formed over a second side 103 of the substrate 102.

The through via 204 is formed in the substrate 102. More particularly, the through via 204 extends through the substrate 102 from the first side 101 of the substrate 102 to the second side 103 of the substrate 102. As shown in FIG. 1, the through via 204 provides a conductive channel between the front side interconnect structures and the backside interconnect structures.

In comparison with conventional interconnect structures, the metal lines (e.g., metal 134) and their adjacent vias (e.g., via 132) of the semiconductor device 100 are formed in a dual damascene structure. More particularly, the metal line 134 and its adjacent via 132 are formed by a plating process without an etching step, which is commonly used in a dual damascene process. As a result, it is not necessary to have an etch stop layer underneath the metal lines (e.g., metal line 134).

In addition, there is no recess in the metal line (e.g., metal line 206), upon which the dual damascene structure comprising the metal via 132 and the metal line 134 are formed. In other words, the bottom surface of the dual damascene structure is in direct contact with the top surface of the metal line 206 under the dual damascene structure. As shown in FIG. 1, the bottom surface of the dual damascene structure is coplanar with the top surface of the metal line 206. The detailed formation process of the dual damascene structure as well as other interconnect structures will be described below with respect to FIGS. 2-21.

Figure 2:
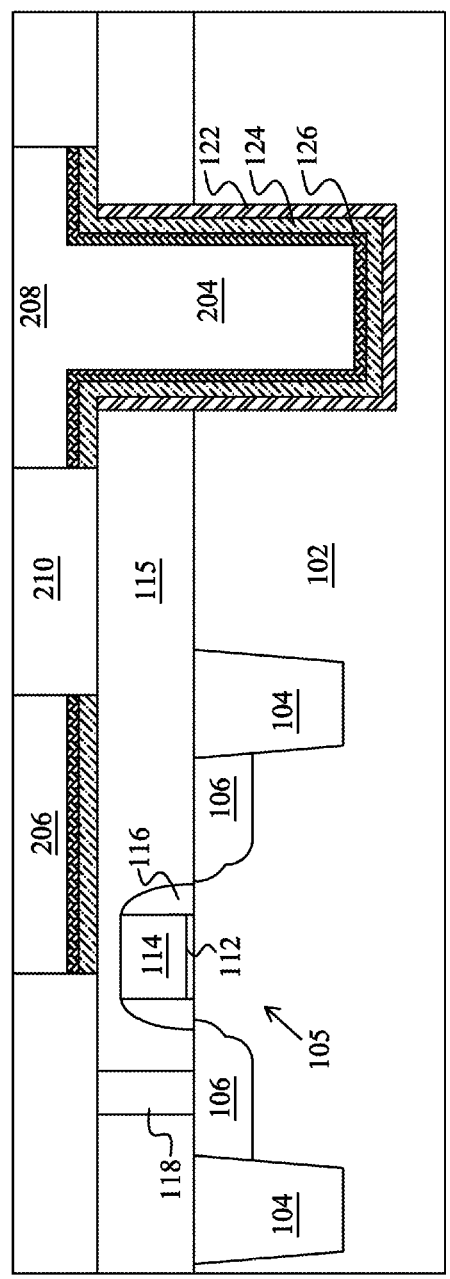
FIG. 2 illustrates a semiconductor device after a variety of electrical circuits have been formed in the substrate in accordance with an embodiment.

FIGS. 2 to 21 illustrate intermediate steps of fabricating the semiconductor device shown in FIG. 1 in accordance with an embodiment. FIG. 2 illustrates a semiconductor device after a variety of electrical circuits have been formed in the substrate in accordance with an embodiment. The substrate 102 may be formed of silicon, although it may also be formed of other group III, group IV, and/or group V elements, such as silicon, germanium, gallium, arsenic, and combinations thereof.

The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like.

As shown in FIG. 2, a metal oxide semiconductor (MOS) transistor 105 and its associated contact plug 118 are used to represent the electrical circuits of the semiconductor device. The MOS transistor 105 is formed in the substrate 102. The MOS transistor 105 includes two drain/source regions 106. As shown in FIG. 2, the drain/source regions 106 are formed on opposite sides of a gate stack. The gate stack includes a gate dielectric layer 112 formed over the substrate 102, a gate electrode formed over the gate dielectric layer 112 and gate spacers 116. As shown in FIG. 2, there may be two isolation regions 104 formed on opposite sides of the MOS transistor 105.

The isolation regions 104 may be shallow trench isolation (STI) regions, and may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a CMP process may be applied to the top surface so that the excess dielectric material may be removed as a result.

The gate dielectric 112 may be a dielectric material such as silicon oxide, silicon oxynitride, silicon nitride, an oxide, a nitrogen-containing oxide, a combination thereof and/or the like. The gate dielectric 112 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric 112 comprises an oxide layer, the gate dielectrics 112 may be formed by a PECVD process using tetraethoxysilane (TEOS) and oxygen as a precursor. In accordance with an embodiment, the gate dielectric 112 may be of a thickness in a range from about 8 Å to about 200 Å.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is poly-silicon, the gate electrode 114 may be formed by depositing doped or undoped poly-silicon by low-pressure chemical vapor deposition (LPCVD) to a thickness in the range of about 400 Å to about 2,400 Å.

The spacers 116 may be formed by blanket depositing one or more spacer layers (not shown) over the gate electrode 114 and the substrate 102. The spacer layers 116 may comprise suitable dielectric materials such as SiN, oxynitride, SiC, SiON, oxide and/or the like. The spacer layers 116 may be formed by commonly used techniques such as CVD, PECVD, sputter and/or the like.

The drain/source regions 106 may be formed in the substrate 102 on opposing sides of the gate dielectric 112. In an embodiment in which the substrate 102 is an n-type substrate, the drain/source regions 106 may be formed by implanting appropriate p-type dopants such as boron, gallium, indium and/or the like. Alternatively, in an embodiment in which the substrate 102 is a p-type substrate, the drain/source regions 106 may be formed by implanting appropriate n-type dopants such as phosphorous, arsenic and/or the like.

An interlayer dielectric layer 115 is formed on top of the substrate 102. The interlayer dielectric layer 115 may be formed, for example, of a low-K dielectric material, such as silicon oxide. The interlayer dielectric layer 115 may be formed by any suitable method known in the art, such as spinning, chemical vapor deposition (CVD) and plasma enhanced chemical vapor deposition (PECVD). It should also be noted that one skilled in the art will recognize while FIG. 2 illustrates a single interlayer dielectric layer, the interlayer dielectric layer 115 may comprise a plurality of dielectric layers.

As shown in FIG. 2, the interlayer dielectric layer 115 is formed over the substrate 102. There may be a contact plug 118 formed in the interlayer dielectric layer 115. The contact plug 118 is formed through the interlayer dielectric layer 115 to provide an electrical connection between the MOS transistor 105 and the front side interconnect structures (not shown but illustrated in FIG. 21) formed over the interlayer dielectric layer 115.

The contact plug 118 may be formed by using photolithography techniques to deposit and pattern a photoresist material on the interlayer dielectric layer 115. A portion of the photoresist is exposed according to the location and shape of the contact plug 118. An etching process, such as an anisotropic dry etch process, may be used to create an opening in the interlayer dielectric layer 115.

A conductive liner may be deposited prior to filling the contact plug hole. The conductive liner is preferably conformal, and may comprise a single layer of Ta, TaN, WN, WSi, TiN, Ru and any combinations thereof. The conductive liner may be typically used as a barrier layer for preventing the conductive material such as copper from diffusing into the underlying substrate 102. The conductive liner may be deposited by using suitable deposition process such as CVD, PVD, Atomic Layer Deposition (ALD) and/or the like.

A conductive material is then filled in the opening. The conductive material may be deposited by using CVD, PVD or ALD. The conductive material is deposited over the conductive liner to fill the contact plug opening. Excess portions of the conductive material are removed from the top surface of the interlayer dielectric layer 115 by using a planarization process such as CMP. The conductive material may be copper, tungsten, aluminum, silver, titanium, titanium nitride, tantalum and combinations thereof and/or the like.

The semiconductor device may comprise a through via 204. The through via 204 is formed in a via opening, which extends deeper than the depth of the electrical circuits (e.g., MOS transistor 105) of the semiconductor device. In order to insulate the conductive material of the through via 204 from the substrate 102, a liner layer 122 is formed on the sidewalls and bottom of the via opening. A barrier 124 is formed over the liner layer 122. Furthermore, in order to facilitate the plating process, a seed layer 126 may be formed over the barrier layer 124. A conductive material such as copper may fill the via opening to form the through via 204 through a plating process.

An inter-metal dielectric layer 210 is formed over the interlayer dielectric layer 115. There may be two metal lines 206 and 208 embedded in the inter-metal dielectric layer 210. More particularly, the metal line 208 is coupled to the upper terminal of the through via 204. It should be noted that the metal lines 206 and 208 may be formed at the same step as the through via 204. Therefore, the metal lines 206 and 208 may comprise the same barrier layer and seed layer as the through via 204.

The inter-metal dielectric layer 210 may be formed of a low-K dielectric material such as fluorosilicate glass (FSG) and/or the like. The inter-metal dielectric layer 210 may be formed by suitable deposition techniques such as PECVD techniques, high-density plasma chemical vapor deposition (HDPCVD) and/or the like.

Figure 3:
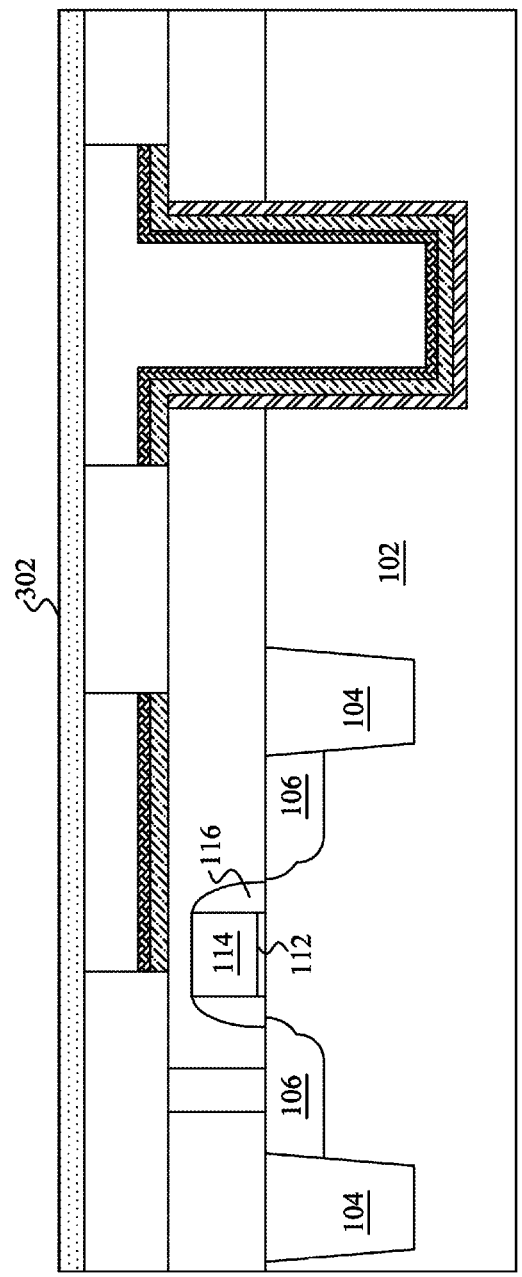
FIG. 3 illustrates a cross sectional view of the semiconductor device shown in FIG. 2 after a first dielectric layer is formed over the substrate in accordance with an embodiment.

FIG. 3 illustrates a cross sectional view of the semiconductor device shown in FIG. 2 after a first dielectric layer is formed over the substrate in accordance with an embodiment. The first dielectric layer 302 may comprise a photo-sensitive material. Throughout the description, the first dielectric layer 302 may be alternatively referred to as the first photo-sensitive layer 302.

The photo-sensitive material may comprise polybenzoxazole (PBO), SU-8 photo-sensitive epoxy, film type polymer materials and/or the like. It should be noted that while FIG. 3 illustrates a photo-sensitive material layer, the first photo-sensitive material layer 302 may be formed of polymer materials including non photo-sensitive materials such as molding compounds, rubber, glass, Si, substrate materials and/or the like. In accordance with an embodiment, the photo-sensitive material is deposited over the substrate 102 by using suitable techniques such as spin coating and/or the like.

Figure 4:
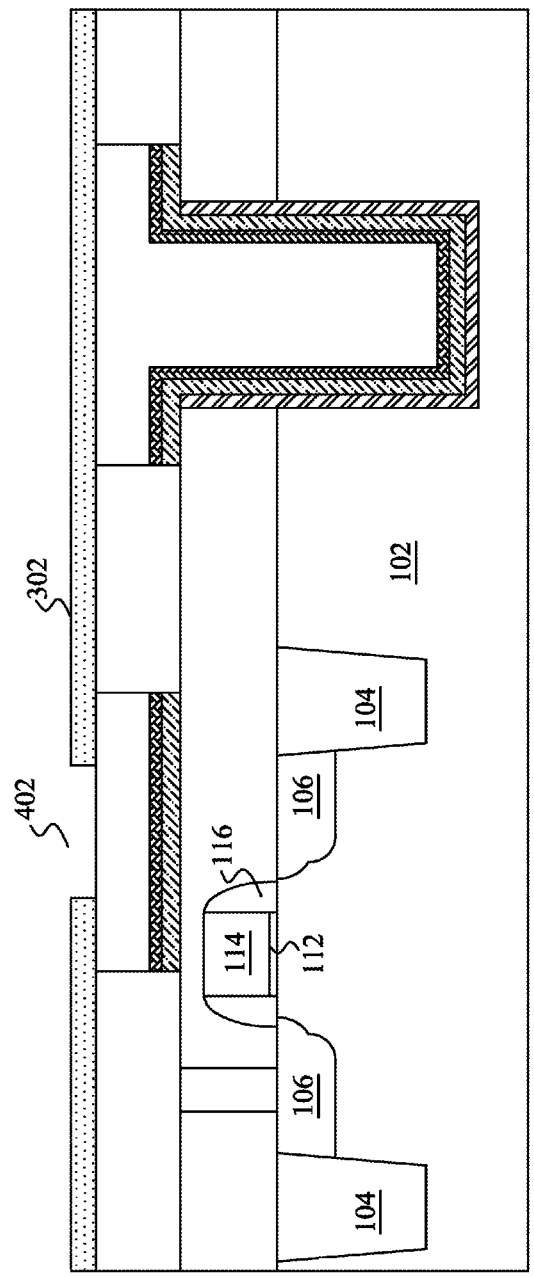
FIG. 4 illustrates a cross sectional view of the semiconductor device shown in FIG. 3 after an opening is formed in the first dielectric layer in accordance with an embodiment.

FIG. 4 illustrates a cross sectional view of the semiconductor device shown in FIG. 3 after an opening is formed in the first dielectric layer in accordance with an embodiment. In consideration of electrical and thermal needs, selective areas of the first photo-sensitive material layer 302 are exposed to light. The physical properties of the photo-sensitive regions exposed to light change as a result. According to an embodiment, the change of the physical properties of the exposed regions will cause the exposed regions removed during a development step. As a result, an opening 402 is formed.

Figure 5:
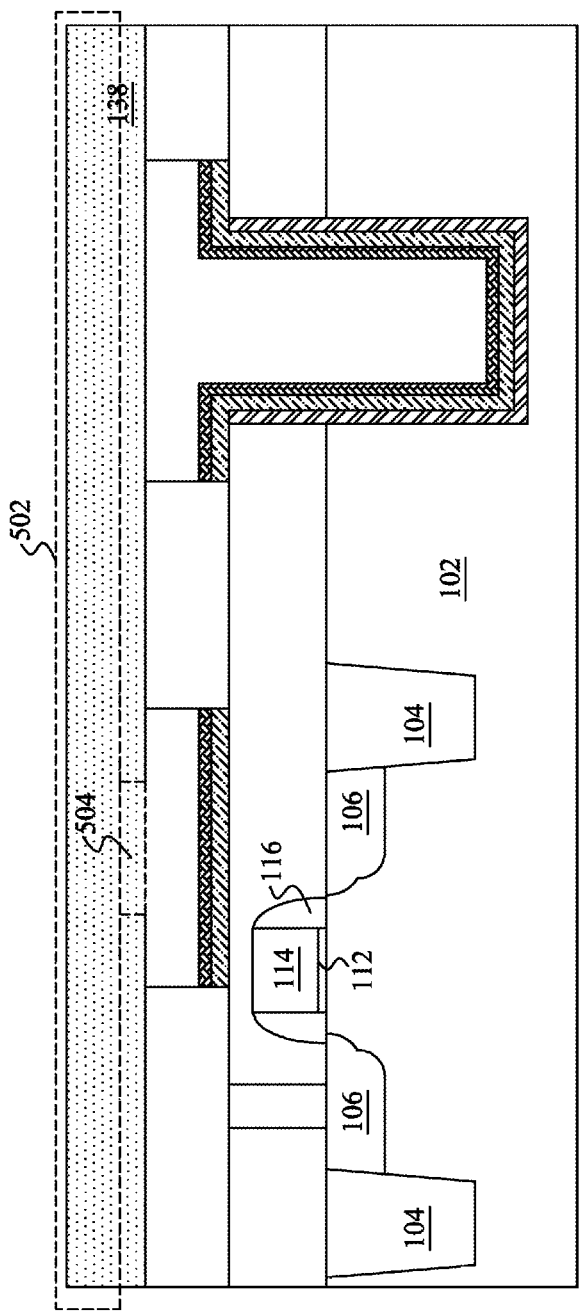
FIG. 5 illustrates a cross sectional view of the semiconductor device shown in FIG. 4 after a second dielectric layer is formed over the first dielectric layer in accordance with an embodiment.

FIG. 5 illustrates a cross sectional view of the semiconductor device shown in FIG. 4 after a second dielectric layer is formed over the first dielectric layer in accordance with an embodiment. A second dielectric layer 502 is deposited on the first dielectric layer. The second dielectric layer 502 may comprise a same material as the first dielectric layer 302. In accordance with an embodiment, the second dielectric layer may comprise polybenzoxazole (PBO), SU-8 photo-sensitive epoxy, film type polymer materials and/or the like. The second dielectric layer 502 may be formed by suitable fabrication techniques such as spin coating and/or the like. As shown in FIG. 5, because the first and second dielectric layers are formed of the same dielectric material, the first dielectric layer 302 and the second dielectric layer 502 may merge into a single dielectric layer 138 as shown in FIG. 5.

It should be noted that during the process of forming the second dielectric layer 502, the opening 402 (shown in FIG. 4) may be filled with the dielectric material as indicated by the dashed rectangle 504. In order to form a via, the dielectric material in the dashed rectangle 504 may be removed during a subsequent step described below with respect to FIG. 6. As such, the fabrication step shown in FIG. 4 may be an optional step for some applications. However, when the via (e.g., opening 402) is of a small diameter such as a high resolution via, it is necessary to form the opening 402 after the first dielectric layer is formed. In contrast, if the via opening is not formed before the second dielectric layer is deposited, the photo-sensitive material removal process may not form a high resolution via as the thickness of the dielectric layer increases. As a result, good resolution may not be achieved.

Figure 6:
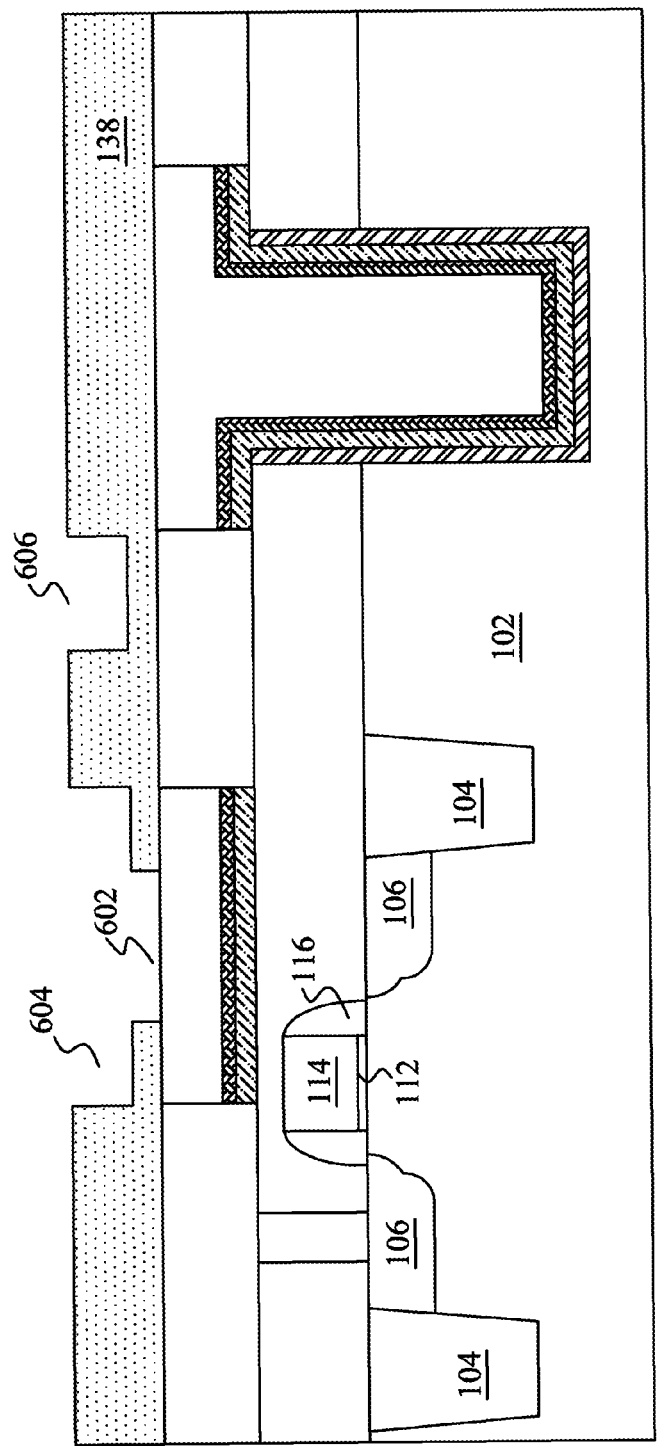
FIG. 6 illustrates a cross sectional view of the semiconductor device shown in FIG. 5 after a dual damascene structure is formed in dielectric layer in accordance with an embodiment.

FIG. 6 illustrates a cross sectional view of the semiconductor device shown in FIG. 5 after a dual damascene structure is formed in dielectric layer in accordance with an embodiment. A patterning process is applied to the dielectric layer 138 in accordance with an embodiment. In consideration of the location of metal lines and the through via, selective areas of the dielectric layer 138 are exposed to light. A developer is applied to the exposed regions. As a result, portions of the dielectric layer 138 are removed to form the via opening 602, the metal line opening 604 and the metal line opening 606. It should also be noted that the damascene interconnect opening may be formed by one or more alternative process steps (e.g., a via first or a trench first damascene process).

After the dual damascene structure is formed, a curing process may be applied to the semiconductor device so that a firm dual damascene structure may be achieved through the hardening of the photo-sensitive material of the dielectric layer 138. In accordance with an embodiment, the curing temperature of the semiconductor device may be in a range from about 150 degrees to about 400 degrees.

Figure 7:
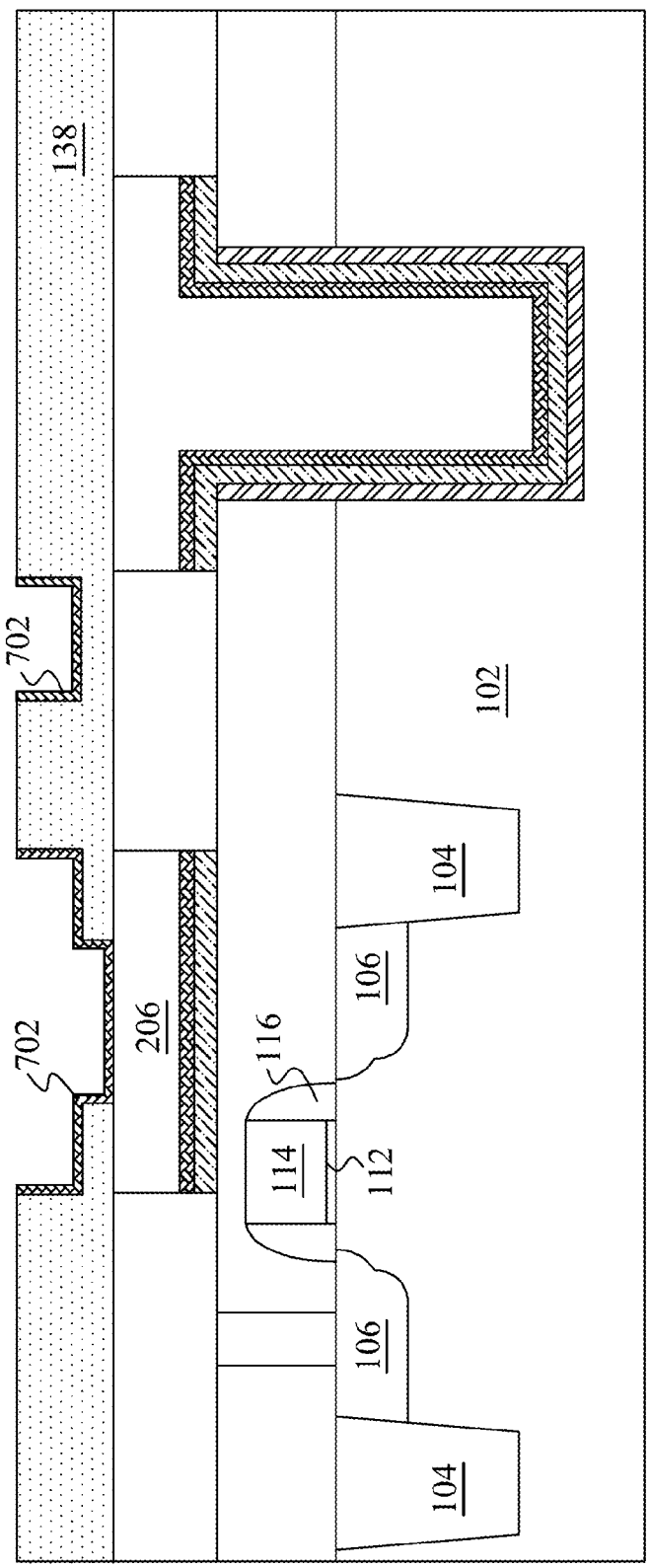
FIG. 7 illustrates a cross sectional view of the semiconductor device shown in FIG. 6 after a barrier layer and a seed layer are formed in accordance with an embodiment.

FIG. 7 illustrates a cross sectional view of the semiconductor device shown in FIG. 6 after a barrier layer and a seed layer are formed in accordance with an embodiment. A thin layer 702 is formed on the sidewalls and bottom of the dual damascene structure. The thin layer 702 comprises a barrier and a seed layer formed over the barrier layer.

The barrier layer may be formed of titanium, titanium nitride, tantalum, tantalum nitride, and combinations thereof and/or the like. The barrier layer may be formed using suitable fabrication techniques such as ALD, PECVD, plasma enhanced physical vapor deposition (PEPVD) and/or the like.

The seed layer may be may be formed of copper, nickel, gold, any combination thereof and/or the like. The seed layer may be formed by suitable deposition techniques such as PVD, CVD and/or the like. The seed layer may have a thickness in a range from about 50 Å to about 1,000 Å.

In addition, the seed layer may be alloyed with a material that improves the adhesive properties of the seed layer so that it can act as an adhesion layer. For example, the seed layer may be alloyed with a material such as manganese or aluminum, which will migrate to the interface between the seed layer and the barrier layer and will enhance the adhesion between these two layers. The alloying material may be introduced during formation of the seed layer. The alloying material may comprise no more than about 10% of the seed layer.

Figure 8:
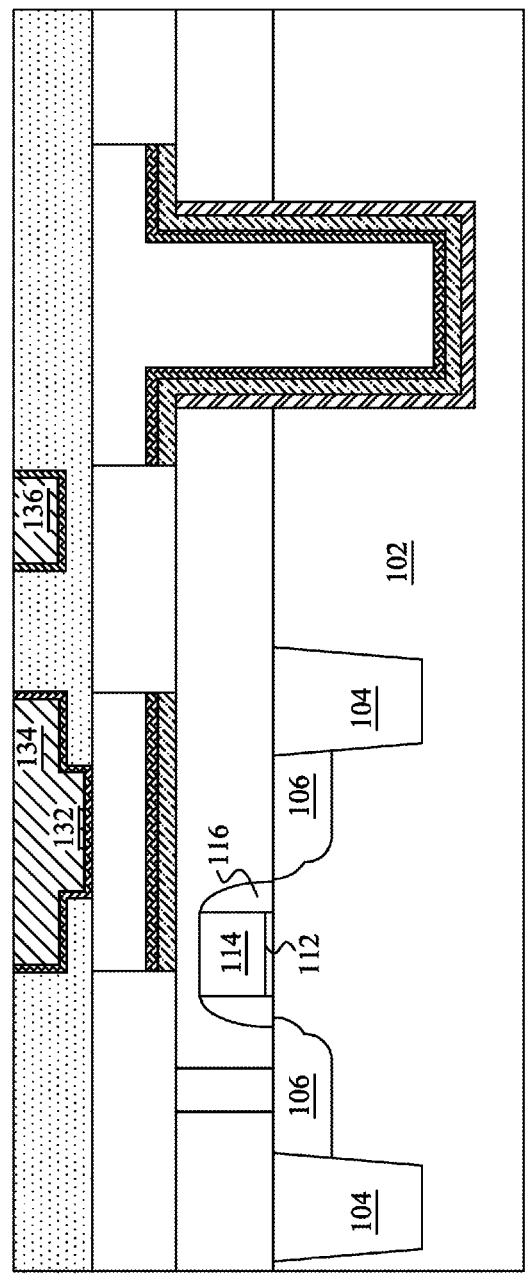
FIG. 8 illustrates a cross sectional view of the semiconductor device shown in FIG. 7 after a conductive material is filled in the openings in accordance with an embodiment.

FIG. 8 illustrates a cross sectional view of the semiconductor device shown in FIG. 7 after a conductive material is filled in the openings in accordance with an embodiment. The dual damascene opening as well as the metal line opening may be filled with a conductive material. The conductive material may comprise copper, although other suitable materials such as aluminum, alloys, tungsten, silver, doped polysilicon, combinations thereof, and/or the like, may alternatively be utilized. The conductive material may be filled in the opening through suitable techniques such as an electroplating process.

One advantageous feature of having the metal lines formed by the fabrication process shown is that the metal lines' formation does not require an etching process. As a result, the step of forming an etch stop layer is saved. In comparison with conventional etching based techniques, the total production time of the semiconductor device is reduced. Moreover, without an etching process commonly used in the traditional fabrication process, the resolution of metal lines and vias may be improved. As a result, fine pitch interconnect structures can be achieved by using the fabrication steps shown above.

Figure 9:
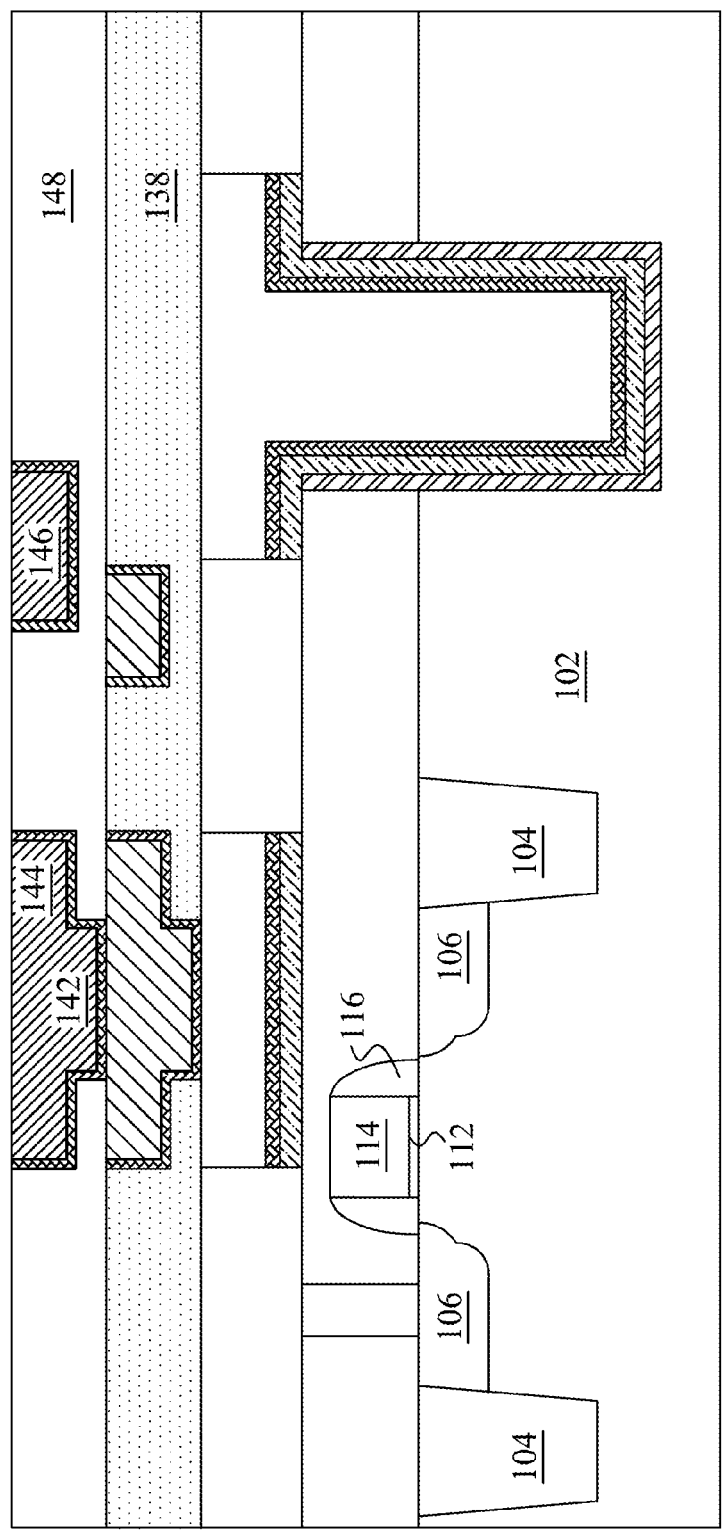
FIG. 9 illustrates a cross sectional view of the semiconductor device shown in FIG. 8 after one additional dual damascene structure is formed in accordance with an embodiment.

FIG. 9 illustrates a cross sectional view of the semiconductor device shown in FIG. 8 after one additional dual damascene structure is formed in accordance with an embodiment. One more dielectric layer 148 is formed over the dielectric layer 138. The dielectric layer 148 may be formed of the same material as the dielectric layer 138. Metal lines 144, 146 and via 142 may be formed of metal materials such as copper, copper alloys, aluminum, silver, gold, any combinations thereof and/or the like. The formation process of the metal interconnect structures of the dielectric layer 148 is similar to the formation process of the metal interconnect structures of the dielectric layer 138, and hence is not discussed to avoid repetition.

Figure 10:
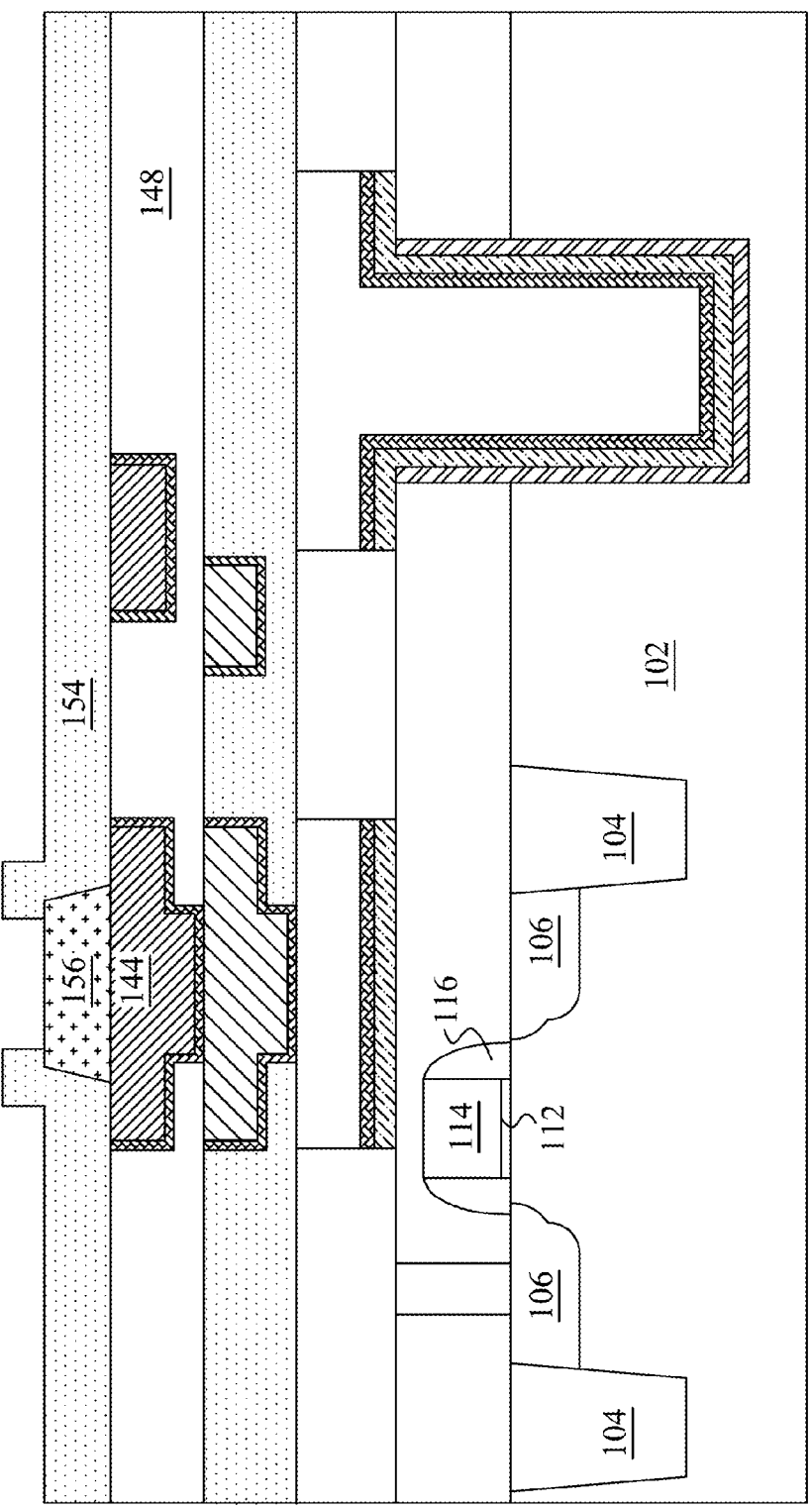
FIG. 10 illustrates a cross sectional view of the semiconductor device shown in FIG. 9 after a passivation layer is formed over the substrate in accordance with an embodiment.

FIG. 10 illustrates a cross sectional view of the semiconductor device shown in FIG. 9 after a passivation layer is formed over the substrate in accordance with an embodiment. The passivation layer 154 is formed of non-organic materials such as un-doped silicate glass, silicon nitride, silicon oxide, silicon oxynitride, boron-doped silicon oxide, phosphorus-doped silicon oxide and/or the like. Alternatively, the passivation layer 154 may be formed of low-k dielectric such as carbon doped oxide and/or the like. In addition, extremely low-k (ELK) dielectrics such as porous carbon doped silicon dioxide can be employed to form the passivation layer 154. The passivation layer 154 may be formed through any suitable techniques such as CVD.

As shown in FIG. 10, there may be an opening formed in the passivation layer 154. The opening is used to accommodate a metal pad 156. As shown in FIG. 10, the metal pad 156 is embedded in the passivation layer 154. In particular, the metal pad 156 provides a conductive channel between the metal lines (e.g., metal line 144) and a post passivation interconnect structure (e.g., redistribution line 166 and bump 176 not shown but illustrated in FIG. 21). The metal pad 156 may be made of metallic materials such as copper, copper alloys, aluminum, silver, gold and any combinations thereof, and/or multi-layers thereof. The metal pad 156 may be formed by suitable techniques such as CVD. Alternatively, the metal pad 156 may be formed by sputtering, electroplating and/or the like.

Figure 11:
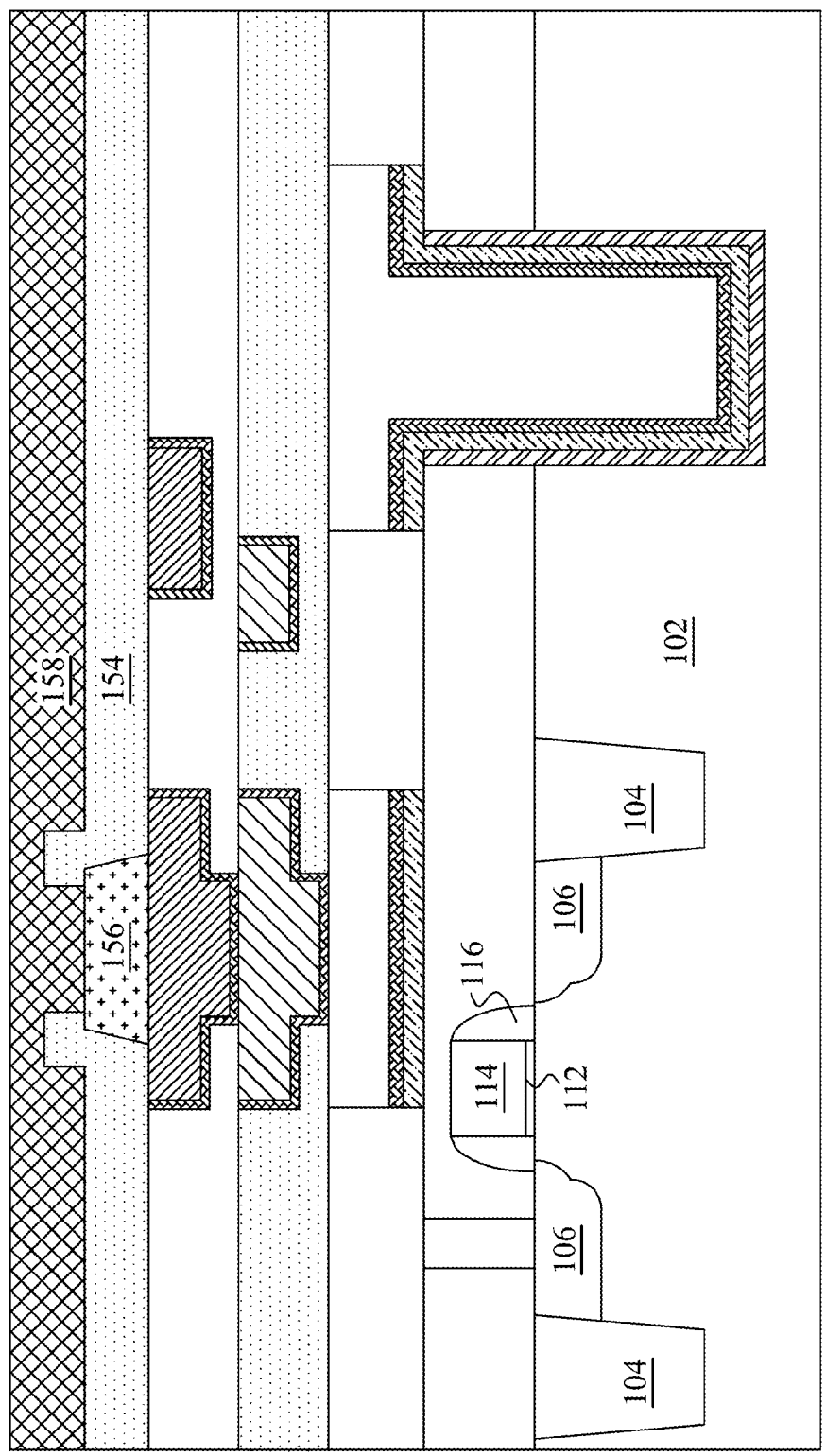
FIG. 11 illustrates a cross sectional view of the semiconductor device shown in FIG. 10 after a first polymer layer is formed on the top of the passivation layer in accordance with an embodiment.

FIG. 11 illustrates a cross sectional view of the semiconductor device shown in FIG. 10 after a first polymer layer is formed on the top of the passivation layer in accordance with an embodiment. The first polymer layer 158 is formed on top of the passivation layer 154. The first polymer layer 158 may be made of polymer materials such as epoxy, polyimide, polybenzoxazole (PBO), silicone, benzocyclobutene (BCB), molding compounds and/or the like. In accordance with an embodiment, the first polymer layer 158 may be formed of PBO. The first polymer layer 158 may be made by suitable deposition methods known in the art such as spin coating.

Figure 12:
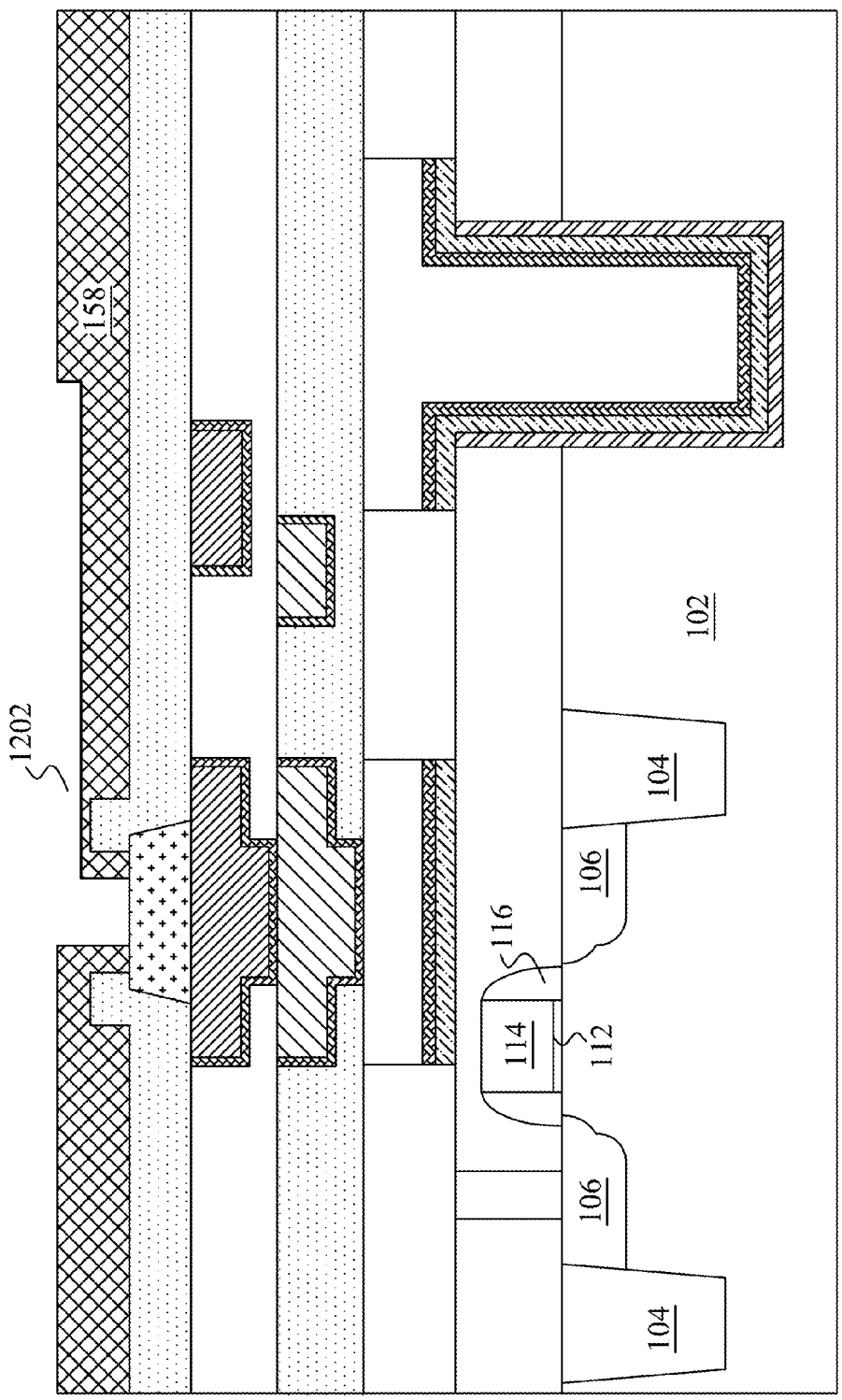
FIG. 12 illustrates a cross sectional view of the semiconductor device shown in FIG. 11 after a patterning process is applied to the surface of the first polymer layer in accordance with an embodiment.

FIG. 12 illustrates a cross sectional view of the semiconductor device shown in FIG. 11 after a patterning process is applied to the surface of the first polymer layer in accordance with an embodiment. As shown in FIG. 12, the opening 1202 may be formed by suitable patterning techniques such as an etching process, a laser ablation process and/or the like. Alternatively, the opening 1202 may be formed by a development step, which has been described above with respect to FIGS. 4 and 6.

Figure 13:
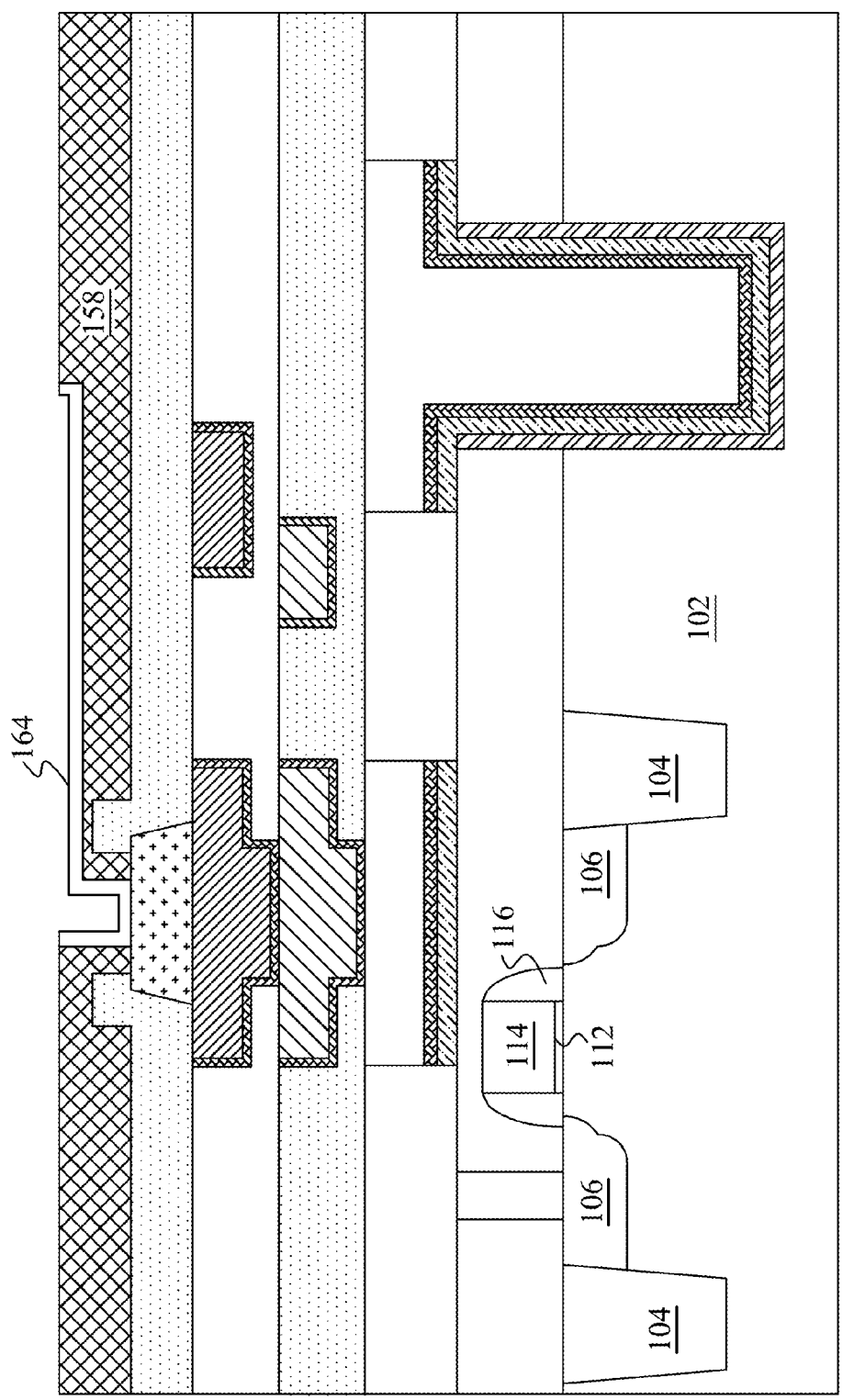
FIG. 13 illustrates a cross sectional view of the semiconductor device shown in FIG. 12 after a seed layer is formed on top of the first polymer layer in accordance with an embodiment.

FIG. 13 illustrates a cross sectional view of the semiconductor device shown in FIG. 12 after a seed layer is formed on top of the first polymer layer in accordance with an embodiment. The seed layer 164 is formed over the first polymer layer 158. The seed layer 164 may comprise two portions, namely a bottom seed layer (not shown) and an upper seed layer (not shown). The bottom seed layer may be a titanium layer, a titanium nitride layer, a tantalum layer, a tantalum nitride layer and/or the like. The upper seed layer may be formed of copper, copper alloys and/or the like. In accordance with an embodiment, the seed layer 164 may be formed using any suitable techniques such as CVD, PVD and/or the like.

Figure 14:
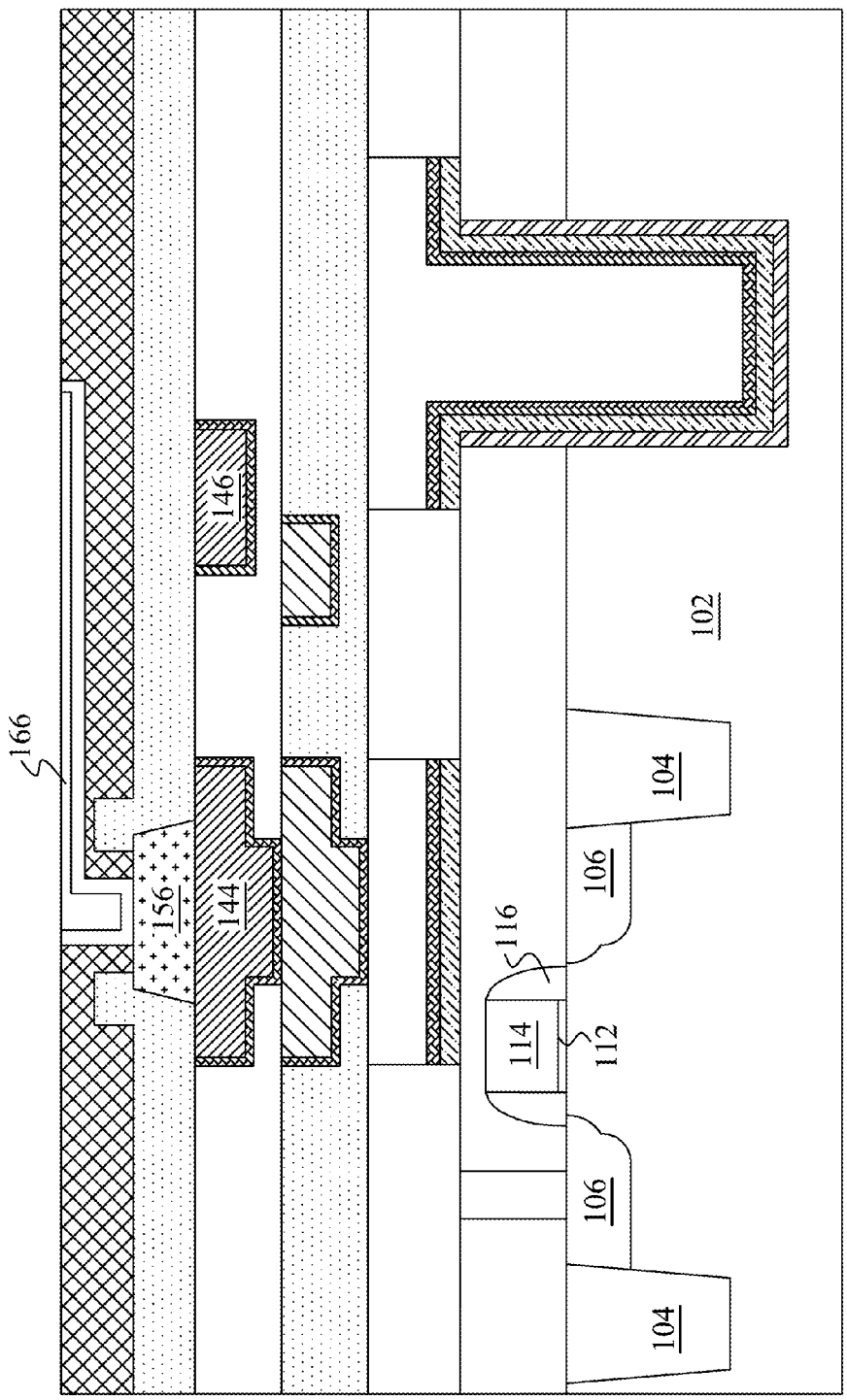
FIG. 14 illustrates a cross sectional view of the semiconductor device shown in FIG. 13 after a redistribution line is formed on top of the seed layer in accordance with an embodiment.

FIG. 14 illustrates a cross sectional view of the semiconductor device shown in FIG. 13 after a redistribution line is formed on top of the seed layer in accordance with an embodiment. As shown in FIG. 14, a conductive material may be filled in the opening (e.g., opening 1202 shown in FIG. 12) to form the redistribution line 166. The conductive material may be copper, but can be any suitable conductive materials, such as copper alloys, aluminum, tungsten, silver, any combinations thereof and/or the like. The redistribution line 166 may be formed by suitable techniques such as an electro-less plating process, CVD, electroplating and/or the like.

As shown in FIG. 14, the redistribution line 166 connects the metal pad 156. More particularly, the redistribution line 166 provides a conductive path between the metal lines (e.g., metal line 144) and the input/output terminal of the semiconductor device (e.g., the bump 176 shown in FIG. 21). The operation principles of redistribution lines are well known in the art, and hence are not discussed in detail herein.

Figure 15:
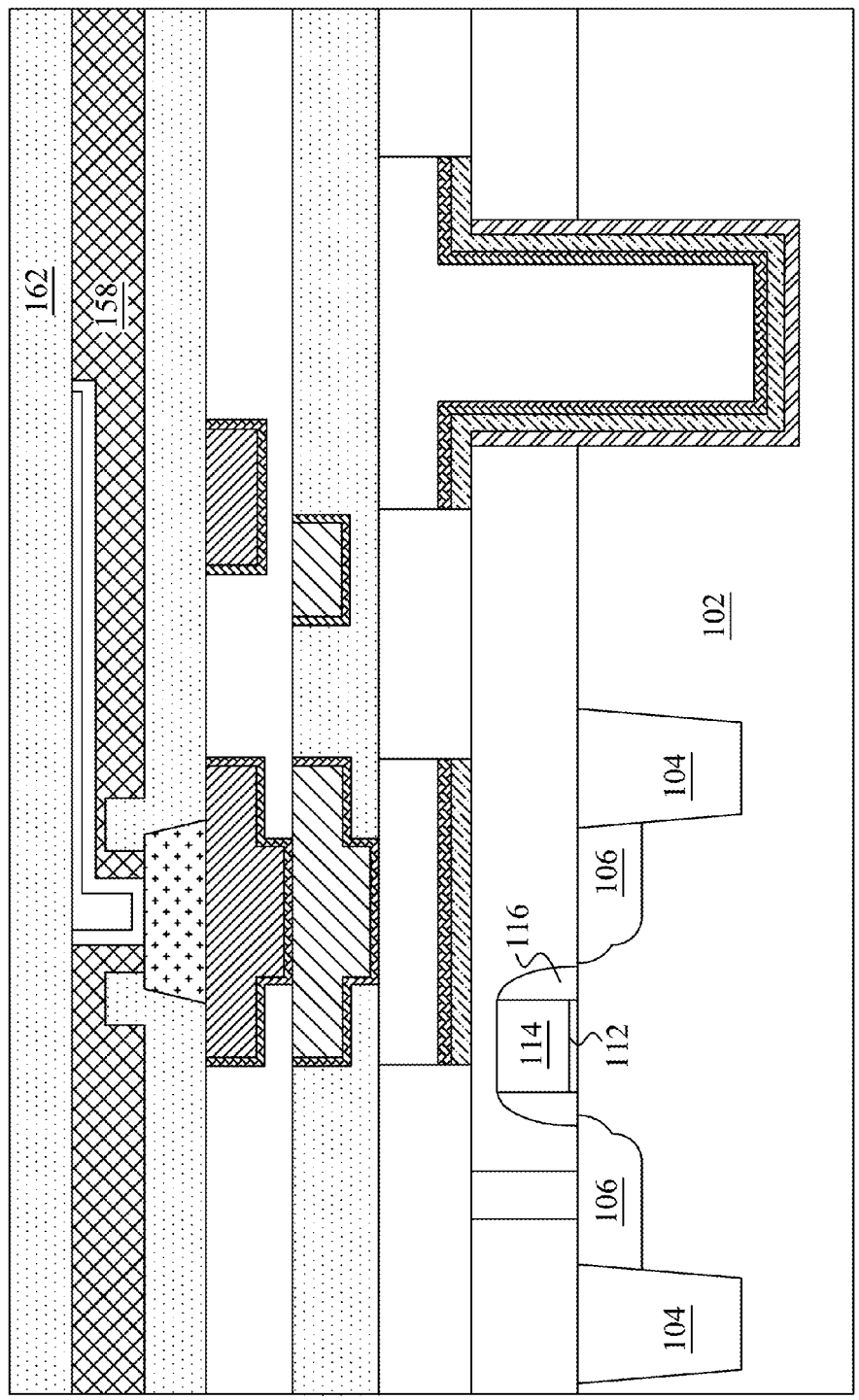
FIG. 15 illustrates a cross sectional view of the semiconductor device shown in FIG. 14 after a second polymer layer is formed over the semiconductor device in accordance with an embodiment.

FIG. 15 illustrates a cross sectional view of the semiconductor device shown in FIG. 14 after a second polymer layer is formed over the semiconductor device in accordance with an embodiment. The second polymer layer 162 is formed on top of the first polymer layer 158. The second polymer layer 162 is made of polymer materials such as epoxy, polyimide, polybenzoxazole (PBO), silicone, benzocyclobutene (BCB), molding compounds and/or the like and/or the like. The second polymer layer 162 may be deposited on the first polymer layer 158 using suitable deposition techniques such as spin coating.

Figure 16:
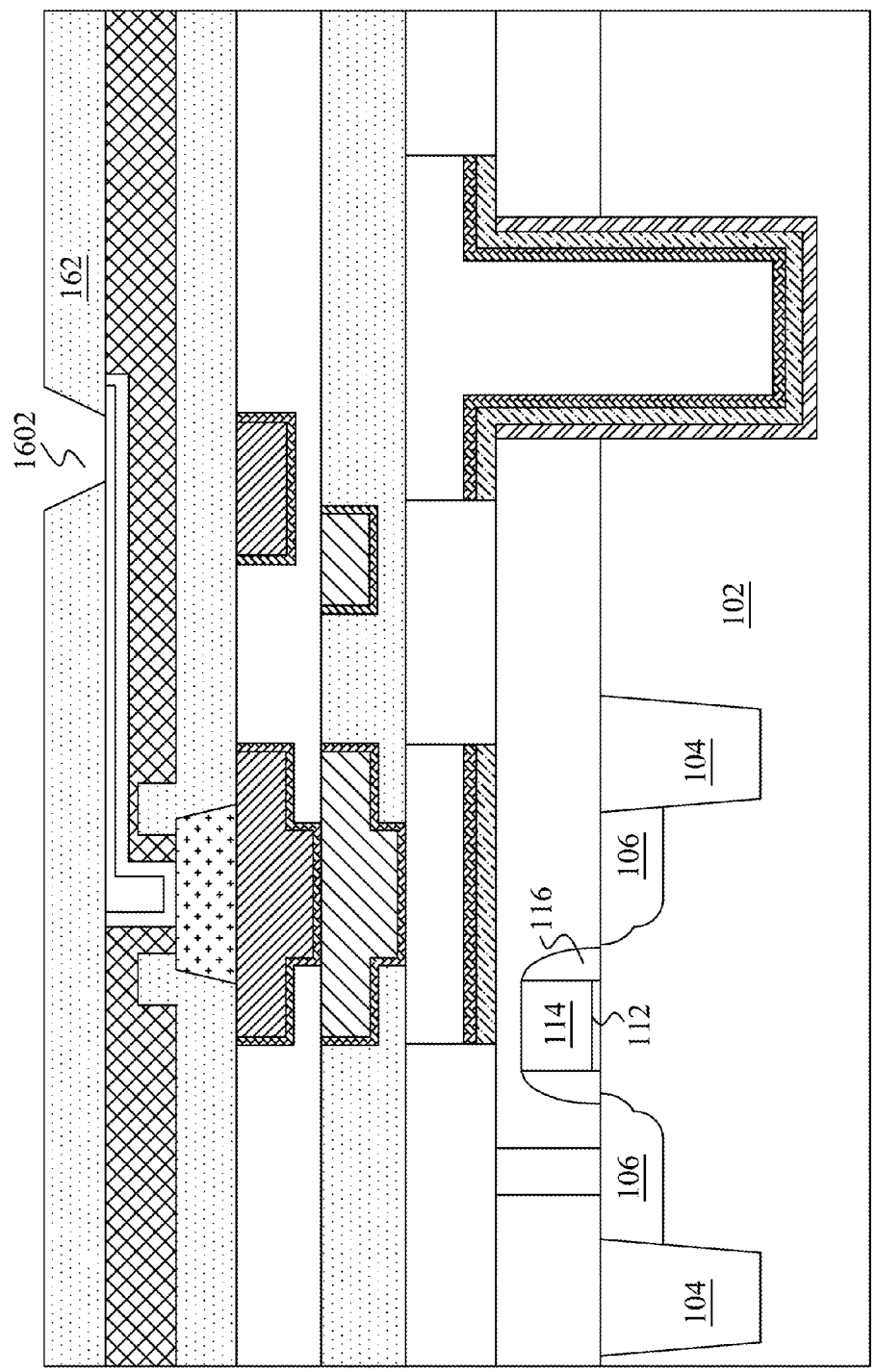
FIG. 16 illustrates a cross sectional view of the semiconductor device shown in FIG. 15 after an opening is formed in the second polymer layer in accordance with an embodiment.

FIG. 16 illustrates a cross sectional view of the semiconductor device shown in FIG. 15 after an opening is formed in the second polymer layer in accordance with an embodiment. As shown in FIG. 16, the opening 1602 is formed by suitable techniques such as an etching process. Alternatively, the opening 1602 may be formed by using a photosensitive material development process.

Figure 17:
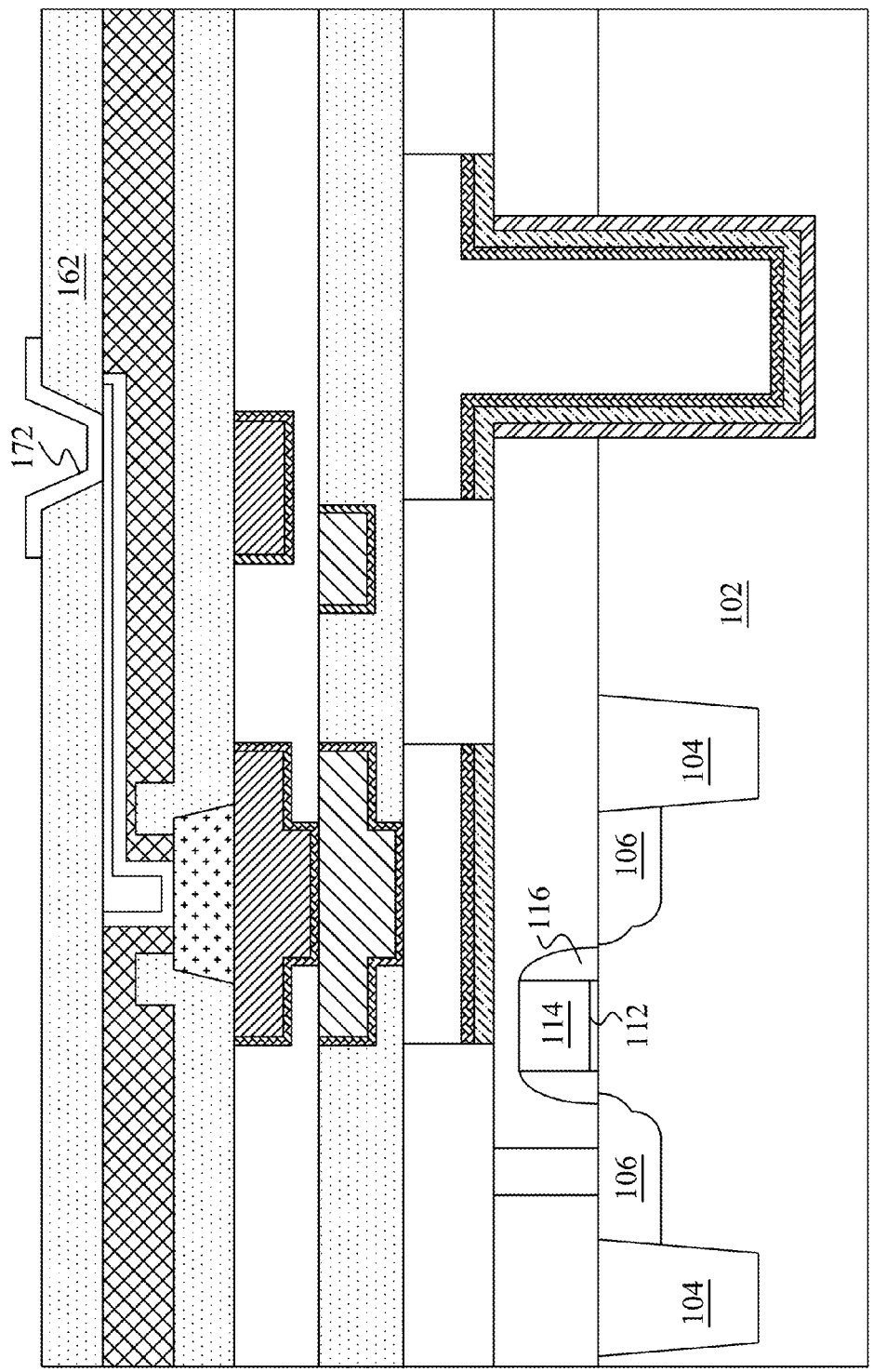
FIG. 17 illustrates a cross sectional view of the semiconductor device shown in FIG. 16 after an under bump metallization (UBM) seed layer is formed on top of the second polymer layer in accordance with an embodiment.

FIG. 17 illustrates a cross sectional view of the semiconductor device shown in FIG. 16 after an under bump metallization (UBM) seed layer is formed on top of the second polymer layer in accordance with an embodiment. The UBM seed layer 172 is deposited on the second polymer layer 162. The UBM seed layer 172 may comprise conductive materials such as copper and/or the like. The UBM seed layer 172 may be implemented by using suitable fabrication techniques such as sputtering, CVD and/or the like.

Figure 18:
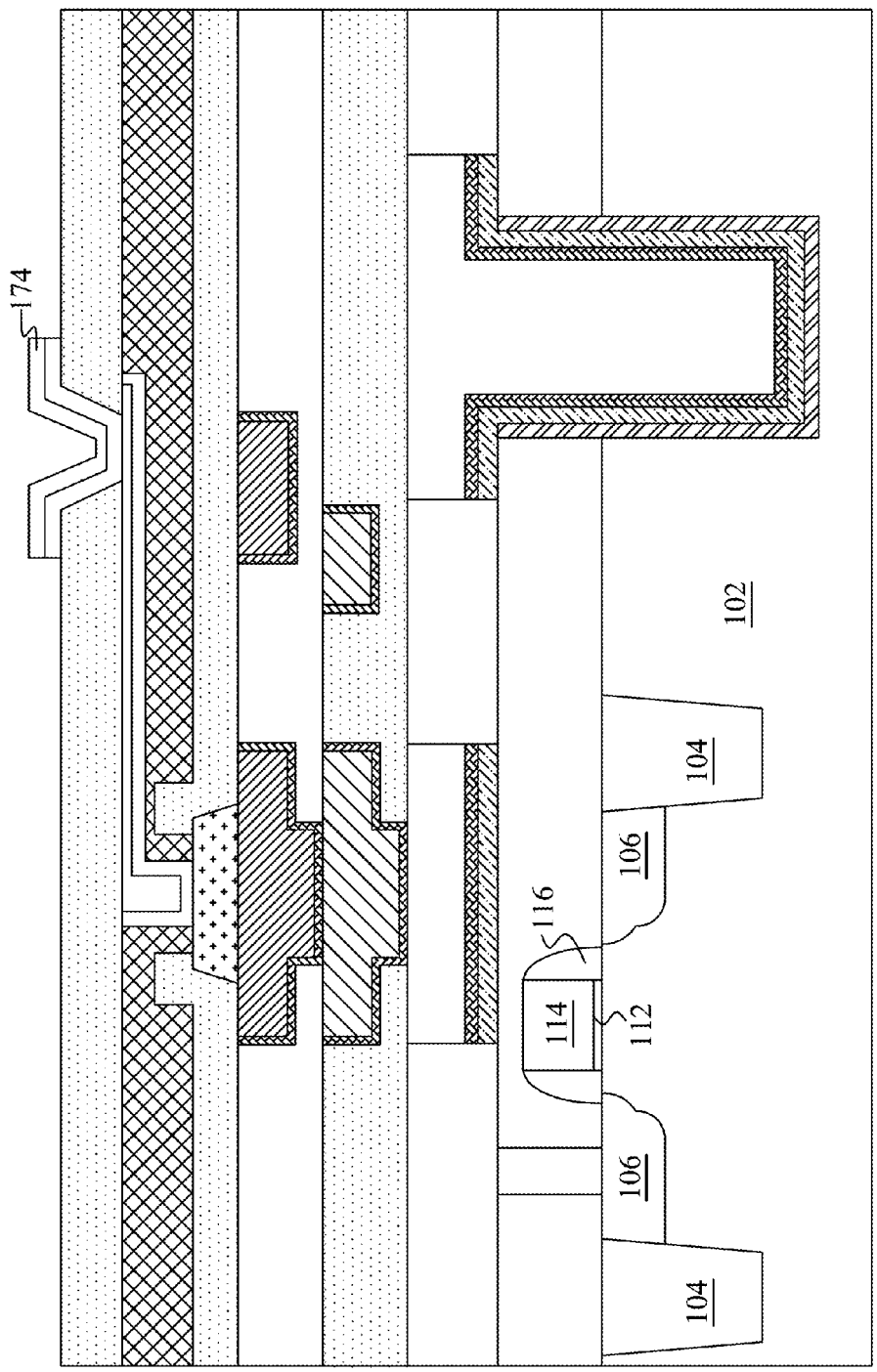
FIG. 18 illustrates a cross sectional view of the semiconductor device shown in FIG. 17 after a second conductive layer is formed on top of the UBM seed layer in accordance with an embodiment.

FIG. 18 illustrates a cross sectional view of the semiconductor device shown in FIG. 17 after a second conductive layer is formed on top of the UBM seed layer in accordance with an embodiment. As shown in FIG. 18, in order to obtain a reliable UBM structure, additional conductive materials may be deposited in a conformal manner on top of the UBM seed layer 172 to form an additional conductive layer 174. The conductive material may be copper, but can be any suitable conductive materials, such as copper alloys, aluminum, tungsten, silver, any combinations thereof and/or the like. The conductive layer 174 may be formed by suitable techniques such as an electro-less plating process.

Figure 19:
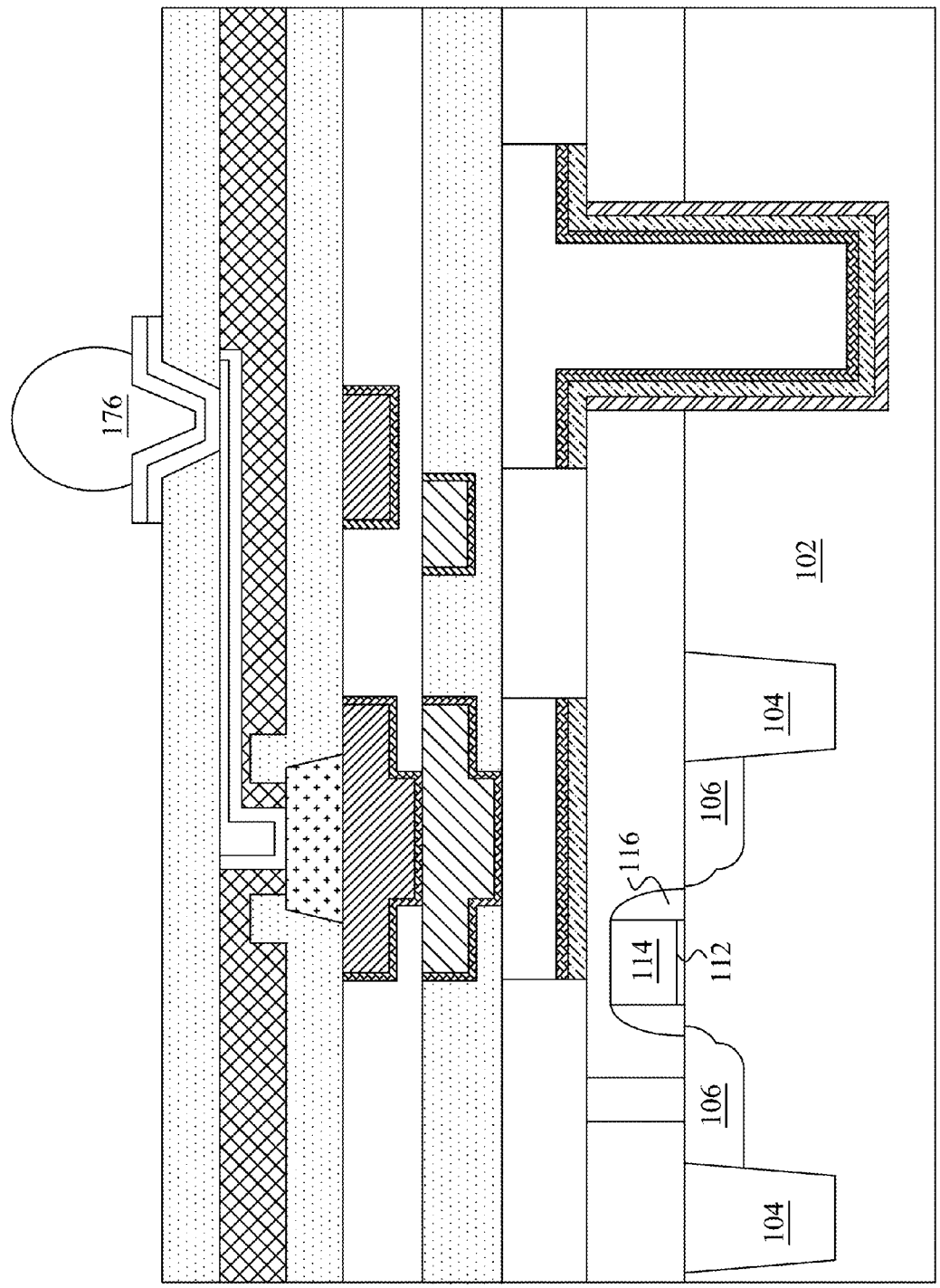
FIG. 19 illustrates a cross section view of the semiconductor device shown in FIG. 18 after an interconnect bump is formed on the UBM structure in accordance with an embodiment.

FIG. 19 illustrates a cross section view of the semiconductor device shown in FIG. 18 after an interconnect bump is formed on the UBM structure in accordance with an embodiment. The interconnect bump 176 provides an effective way to connect the semiconductor device with external circuits (not shown). In accordance with an embodiment, the interconnect bump 176 may be a solder ball. The solder ball 176 may be made of any of suitable materials. In accordance with an embodiment, the solder ball 176 may comprise SAC405. SAC405 comprises 95.5% Sn, 4.0% Ag and 0.5% Cu.

In accordance with another embodiment, the interconnect bump 176 may be a copper bump. The copper bump may be of a height of approximately 45 um. The copper bump may be formed by using a variety of semiconductor packaging technologies such as sputtering, electroplating and/or the like.

Figure 20:
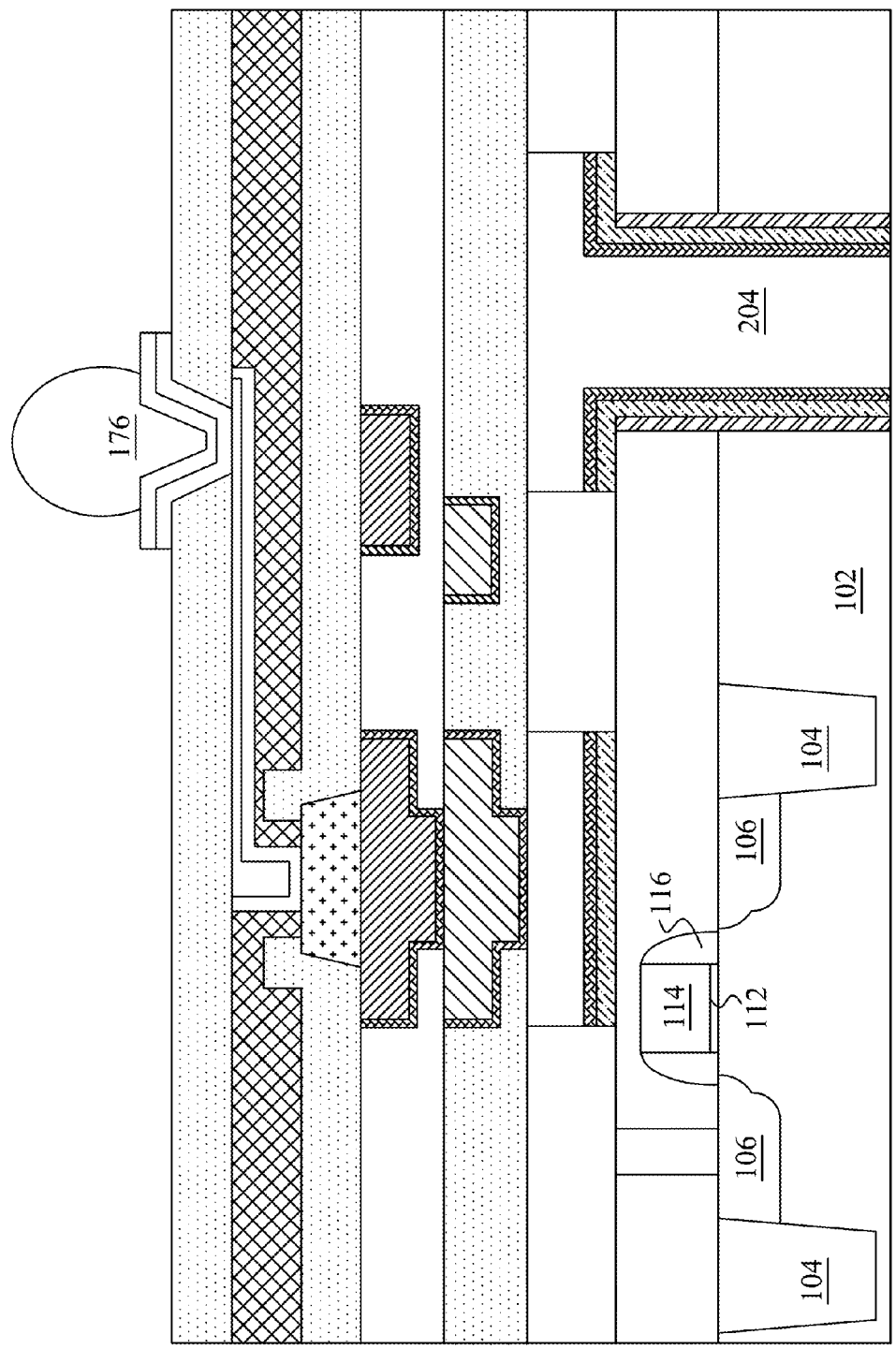
FIG. 20 is a cross sectional view of the semiconductor device illustrated in FIG. 19 after a thinning process has been applied to the second side of the substrate in accordance with an embodiment.

FIG. 20 is a cross sectional view of the semiconductor device illustrated in FIG. 19 after a thinning process has been applied to the second side of the substrate in accordance with an embodiment. According to the fabrication processes of through vias, the second side (a.k.a. backside) of the substrate 102 is thinned until the conductive material of the through via 204 is exposed.

The thinning process may be implemented by using suitable techniques such as grinding, polishing and/or chemical etching, a combination of etching and grinding techniques. In accordance with an embodiment, the thinning process may be implemented by using a CMP process. In the CMP process, a combination of etching materials and abrading materials are put into contact with the backside of the substrate and a grinding pad (not shown) is used to grind away the backside of the substrate 102 until the conductive material of the through via 204 is exposed.

Figure 21:
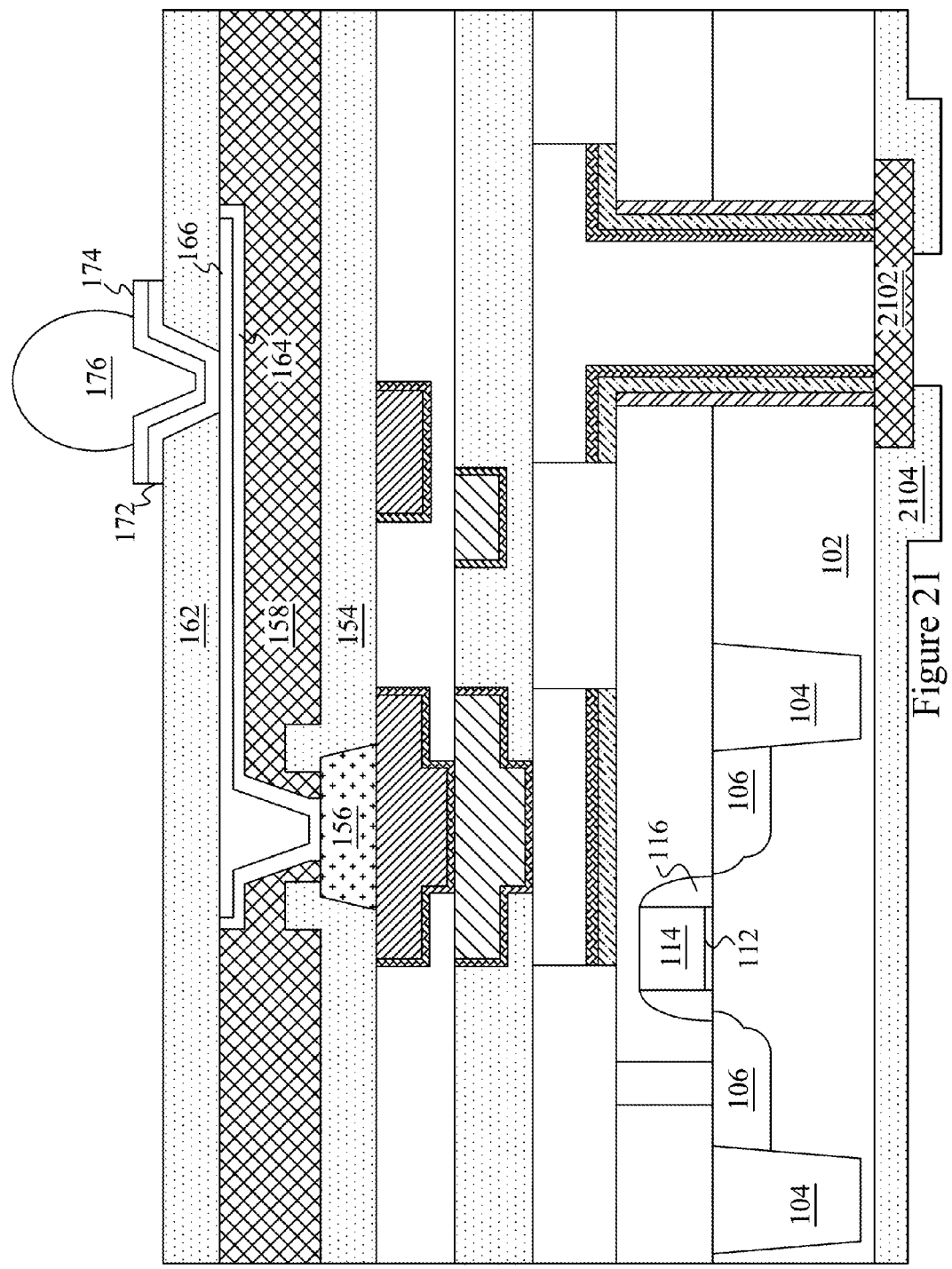
FIG. 21 illustrates a cross section view of the semiconductor device shown in FIG. 20 after a backside contact is formed on the second side of the substrate in accordance with an embodiment.

FIG. 21 illustrates a cross section view of the semiconductor device shown in FIG. 20 after a backside contact is formed on the second side of the substrate in accordance with an embodiment. A cleaning process may be employed to remove any remaining residue such as copper oxide on the backside of the substrate 102, a backside contact 2102 may be formed on the second side of the substrate 102 in electrical contact with the conductive material located within the through via.

The backside contact 2102 may comprise a conductive material. The conductive material may comprise aluminum and may be formed through a sputter deposition process. However, other materials, such as nickel, copper and/or the like may alternatively be used. In addition, other formation processes such as electroplating or electro-less plating may alternatively be employed to form the conductive layer.

A backside passivation layer 2104 may be partially formed over the backside contact 2102 in order to seal and protect the backside contact 2102. The backside passivation layer 2104 may comprise a dielectric material such as an oxide or silicon nitride, although other suitable dielectrics, such as a high-k dielectric, may alternatively be used.

The backside passivation layer 2104 may be formed using a PECVD process, although any other suitable process may alternatively be used. Once the backside passivation layer 2104 is deposited on the second side of the substrate, in order to expose at least a portion of the backside contact 2102, a patterning process may be applied to the backside passivation layer 2104. A suitable etching technique may be applied to the backside passivation layer 2104 so that the backside contact 2102 is exposed. As a result, exterior devices (not shown) may be connected to the backside contact 2102.

Figure 22:
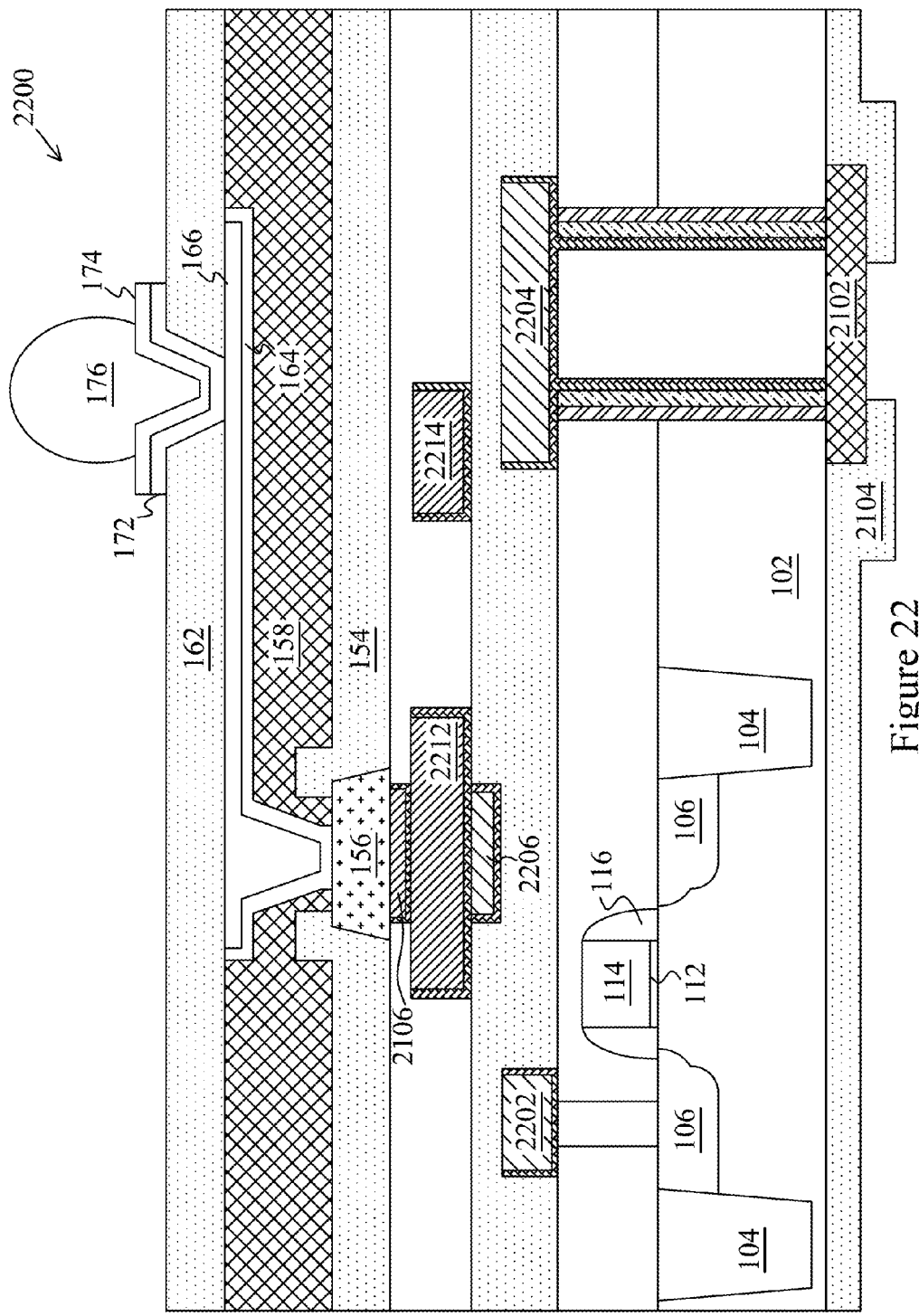
FIG. 22 illustrates a cross sectional view of another semiconductor device similar to the semiconductor device shown in FIG. 1.

FIG. 22 illustrates a cross sectional view of another semiconductor device similar to the semiconductor device shown in FIG. 1. The semiconductor device 2200 is similar to the semiconductor device 100 shown in FIG. 1 except that the semiconductor device 2200 comprise interconnect structures formed by the single damascene technique. The fabrication process described above with respect to FIGS. 2-21 can also be applicable to the formation of single damascene structures. In sum, the metal lines (e.g., metal lines 2202, 2204, 2212 and 2214) and vias (e.g., vias 2206 and 2216) shown in FIG. 22 can be formed by filling conductive materials into openings in photo-sensitive material layer without employ an etching step.

Figure 23:
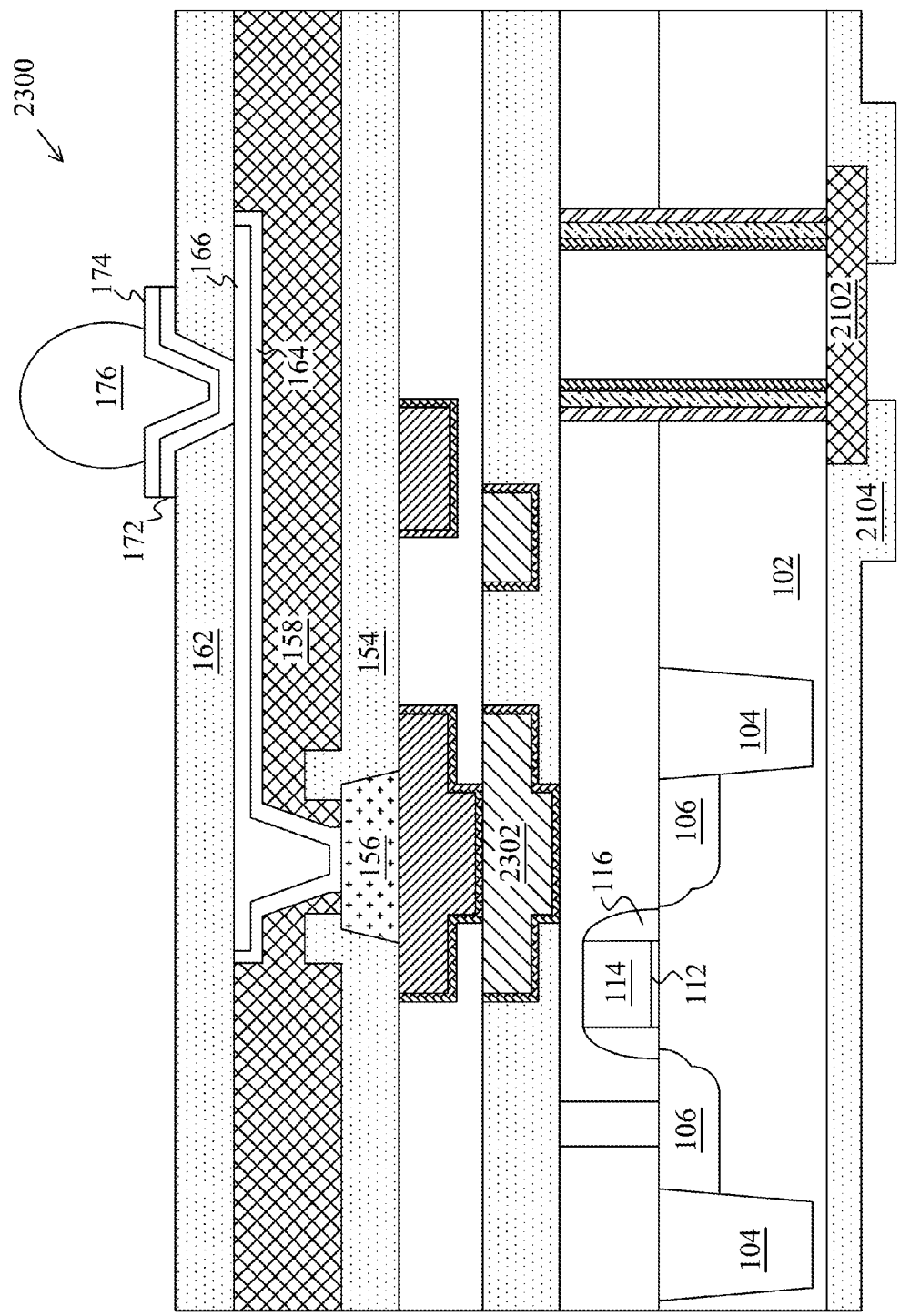
FIG. 23 illustrates a cross sectional view of yet another semiconductor device similar to the semiconductor device shown in FIG. 1.

FIG. 23 illustrates a cross sectional view of yet another semiconductor device similar to the semiconductor device shown in FIG. 1. The semiconductor device 2300 is similar to the semiconductor device 100 shown in FIG. 1 except that the dual damascene structure of the semiconductor device 2300 may be formed upon an interlayer dielectric layer. Referring back to FIG. 7, while the dual damascene structure may be formed upon a metal line (e.g., metal line 206), the dual damascene structure can be formed on other structures. FIG. 23 illustrates an example of forming a dual damascene structure 2302 on top of an interlayer dielectric layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
an interlayer dielectric layer formed on a first side of a substrate;
a first cured photo-sensitive dielectric layer formed over the interlayer dielectric layer;
a second cured photo-sensitive dielectric layer formed over the first cured photo-sensitive dielectric layer, wherein the first cured photo-sensitive dielectric layer is a different material than the second cured photo-sensitive dielectric layer;
a first metal structure extending continuously through the first and second cured photo-sensitive dielectric layers, the first metal structure comprising a single metal layer extending continuously through the first and second cured photo-sensitive dielectric layers;
a third cured photo-sensitive dielectric layer formed over the cured second photo-sensitive dielectric layer;
a fourth cured photo-sensitive dielectric layer formed over the third cured photo-sensitive dielectric layer; and
a second metal structure extending continuously through the third and fourth cured photo-sensitive dielectric layers, the second metal structure comprising a single metal layer extending continuously through the third and fourth cured photo-sensitive dielectric layers.

2. The apparatus of claim 1, wherein:
the first metal structure is a first dual damascene structure comprises:
a first via portion; and
a first metal line portion over the first via portion.

3. The apparatus of claim 2, wherein:
the second metal structure is a second dual damascene structure comprises:
a second via portion; and
a second metal line portion over the second via portion.

4. The apparatus of claim 3, wherein:
a top surface of the first metal line portion is in direct contact with a bottom surface of the second via portion.

5. The apparatus of claim 4, wherein:
the top surface of the second cured photo-sensitive dielectric layer is in direct contact with the bottom surface of the cured third photo-sensitive dielectric layer.

6. The apparatus of claim 1, further comprising:
a first side interconnect structure formed over the first side of the substrate; and
a second side interconnect structure formed over a second side of the substrate, wherein the second side interconnect structure is coupled to the first side interconnect structure through a through via.

7. The apparatus of claim 1, wherein:
the first metal structure and the second metal structure are formed of copper.

8. The apparatus of claim 1, wherein:
the first, second, third, and fourth cured photo-sensitive dielectric layers comprise a cured photo-sensitive polymer material.

9. An apparatus comprising:
an interlayer dielectric layer over a substrate;
a first metallization layer over the interlayer dielectric layer, wherein the first metallization layer comprises a first metal line;
a first cured photo-sensitive dielectric layer over the first metallization layer;
a second cured photo-sensitive dielectric layer over and directly on the first cured photo-sensitive dielectric layer, wherein the first cured photo-sensitive dielectric layer and the second cured photo-sensitive dielectric layer are formed of different materials; and
a metal structure comprising a bottom portion residing in the first cured photo-sensitive dielectric layer and an upper portion residing in the second cured photo-sensitive dielectric layer, wherein a surface of the bottom portion of the metal structure is in direct contact with a top surface of the first metal line, the metal structure comprising a single metal layer residing in the first cured photo-sensitive dielectric layer and in the second cured photo-sensitive dielectric layer.

10. The apparatus of claim 9, wherein:
the metal structure is a dual damascene structure.

11. The apparatus of claim 9, wherein:
the bottom portion is a via; and
the upper portion is a second metal line.

12. The apparatus of claim 9, wherein:
the first cured photo-sensitive dielectric layer and the second cured photo-sensitive dielectric layer are formed of polymer.

13. The apparatus of claim 9, further comprising:
a through via in the substrate.

14. The apparatus of claim 9, further comprising:
a third cured photo-sensitive dielectric layer formed over the second cured photo-sensitive dielectric layer, wherein the third cured photo-sensitive dielectric layer comprises a T-shaped metal structure having a bottom surface in direct contact with a top surface of the upper portion of the metal structure.

15. An apparatus comprising:
a substrate comprising a plurality of transistors and at least one through via;
backside interconnect structures on a first side of the substrate and connected to the at least one through via;
an interlayer dielectric layer on a second side of the substrate;
a metallization layer over the interlayer dielectric layer;
a metal line in the metallization layer;
a first cured photo-sensitive polymer layer over the metallization layer;
a second cured photo-sensitive polymer layer over the first cured photo-sensitive polymer layer, wherein the first cured photo-sensitive polymer layer is a different material than the second cured photo-sensitive polymer layer;
a first T-shaped metal layer extending through the first and second cured photo-sensitive polymer layers, wherein a bottom surface of the first T-shaped metal layer is in direct contact with a top surface of the metal line, wherein the first T-shaped metal layer comprises a single metal layer extending through the second cured photo-sensitive polymer layer and into the first cured photo-sensitive polymer layer;
a third cured photo-sensitive polymer layer over the second cured photo-sensitive polymer layer;
a fourth cured photo-sensitive polymer layer over the third cured photo-sensitive polymer layer; and
a second T-shaped metal layer extending through the third and fourth cured photo-sensitive polymer layers, wherein a bottom surface of the second T-shaped metal layer is in direct contact with a top surface of the first T-shaped metal layer.

16. The apparatus of claim 15, wherein the first T-shaped metal layer comprises:
a first via portion; and
a first metal line portion, and wherein the first metal line portion is connected to the metal line through the first via portion.

17. The apparatus of claim 15, wherein:
a bottom surface of the third cured photo-sensitive polymer layer is in direct contact with a top surface of the second cured photo-sensitive polymer layer.

18. The apparatus of claim 17, wherein:
the top surface of the first T-shaped metal layer is coplanar with the top surface of the second cured photo-sensitive polymer layer; and
the bottom surface of the second T-shaped metal layer is coplanar with the bottom surface of the third cured photo-sensitive polymer layer.

19. The apparatus of claim 15, wherein the first cured photo-sensitive polymer layer comprises polybenzoxazole.

20. The apparatus of claim 1, wherein the first cured photo-sensitive dielectric layer comprises polybenzoxazole or SU-8 photo-sensitive epoxy.

* * * * *